(12) United States Patent
Khananashvili et al.

(10) Patent No.: US 11,677,307 B2
(45) Date of Patent: Jun. 13, 2023

(54) METHOD AND APPARATUS FOR EFFICIENT SWITCHING

(71) Applicant: Solaredge Technologies Ltd., Herzeliya (IL)

(72) Inventors: Shimon Khananashvili, Jerusalem (IL); Yakir Loewenstern, Ariel (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

(21) Appl. No.: 17/393,091

(22) Filed: Aug. 3, 2021

(65) Prior Publication Data

US 2022/0037986 A1 Feb. 3, 2022

Related U.S. Application Data

(60) Provisional application No. 63/060,312, filed on Aug. 3, 2020.

(51) Int. Cl.
*H02M 7/217* (2006.01)
*H02M 1/088* (2006.01)
(Continued)

(52) U.S. Cl.
CPC ......... *H02M 1/088* (2013.01); *H02M 1/0054* (2021.05); *H02M 1/0058* (2021.05); *H02M 3/33515* (2013.01); *H02M 7/217* (2013.01); *H02M 7/219* (2013.01); *H02M 7/5387* (2013.01); *H03K 17/12* (2013.01); *H03K 17/122* (2013.01)

(58) Field of Classification Search
CPC .. H02M 1/088; H02M 1/0054; H02M 1/0058; H02M 3/33515; H02M 7/217; H02M 7/219; H02M 7/5387; H03K 17/12; H03K 17/122; H03K 2217/0036; Y02B 70/10
See application file for complete search history.

(56) References Cited

U.S. PATENT DOCUMENTS 10,291,110 B2 * 5/2019 Watanabe ........ H03K 17/04123
10,831,225 B2 * 11/2020 Araragi ..................... G05F 3/08
(Continued)

FOREIGN PATENT DOCUMENTS

| CN | 110707906 A | 1/2020 |
|----|----|----|
| EP | 3518400 A1 | 7/2019 |

OTHER PUBLICATIONS

Wang Ye et al: "Efficiency Improvement of Grid Inverters With Hybrid Devices", IEEE Transactions on Power Electronics, Institute of Electrical and Electronics Engineers, USA, vol. 34, No. 8, Aug. 1, 2019 (Aug. 1, 2019), pp. 7558-7572, XP011727065, ISSN: 0885-8993, DOI: 10.1109/TPEL.2018.2881115 [retrieved on May 23, 2019].

(Continued)

*Primary Examiner* — Yusef A Ahmed
(74) *Attorney, Agent, or Firm* — Banner & Witcoff, Ltd.

(57) ABSTRACT

Systems, apparatuses, and methods for efficient operation of a switch arrangement are described. Selectively operating one of a plurality of parallel-connected switches at different times along a period of a periodic waveform may allow for improved efficiency, uniform loss-spreading, and enhanced thermal design of an electronic circuit including use of power switches.

9 Claims, 14 Drawing Sheets

(51) Int. Cl.
*H02M 1/00* (2006.01)
*H02M 3/335* (2006.01)
*H02M 7/5387* (2007.01)
*H03K 17/12* (2006.01)
*H02M 7/219* (2006.01)

(56) References Cited

U.S. PATENT DOCUMENTS

| | | | | |
|---|---|---|---|---|
| 2006/0267542 | A1* | 11/2006 | Wei | H02M 7/219 |
| | | | | 318/807 |
| 2008/0030176 | A1 | 2/2008 | Sutardja et al. | |
| 2013/0279228 | A1* | 10/2013 | Zhu | H02M 7/493 |
| | | | | 363/132 |
| 2015/0171770 | A1* | 6/2015 | Wagoner | H02M 1/08 |
| | | | | 363/132 |
| 2016/0105119 | A1* | 4/2016 | Akamatsu | H02M 7/4807 |
| | | | | 363/21.04 |
| 2016/0191021 | A1* | 6/2016 | Zhao | H03K 3/012 |
| | | | | 327/109 |
| 2016/0191046 | A1* | 6/2016 | Zhao | H03K 17/567 |
| | | | | 327/419 |
| 2017/0331362 | A1* | 11/2017 | Butzmann | H02M 1/32 |
| 2017/0349053 | A1* | 12/2017 | Landseadel | H02J 7/02 |
| 2018/0102649 | A1* | 4/2018 | Dewa | H02M 7/219 |
| 2019/0097563 | A1* | 3/2019 | Shimomugi | H03K 17/04123 |
| 2019/0229644 | A1* | 7/2019 | Miyake | H02M 7/5387 |
| 2020/0220449 | A1* | 7/2020 | Koishi | H02P 29/68 |

OTHER PUBLICATIONS

Jan. 7, 2022—European Search Report—EP App. No. 21189344.1.

* cited by examiner

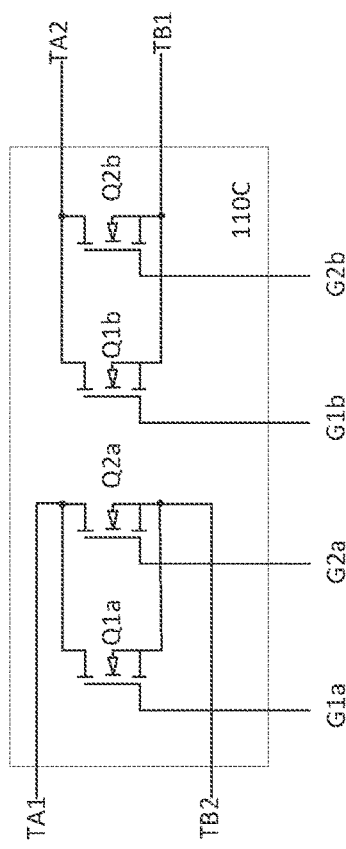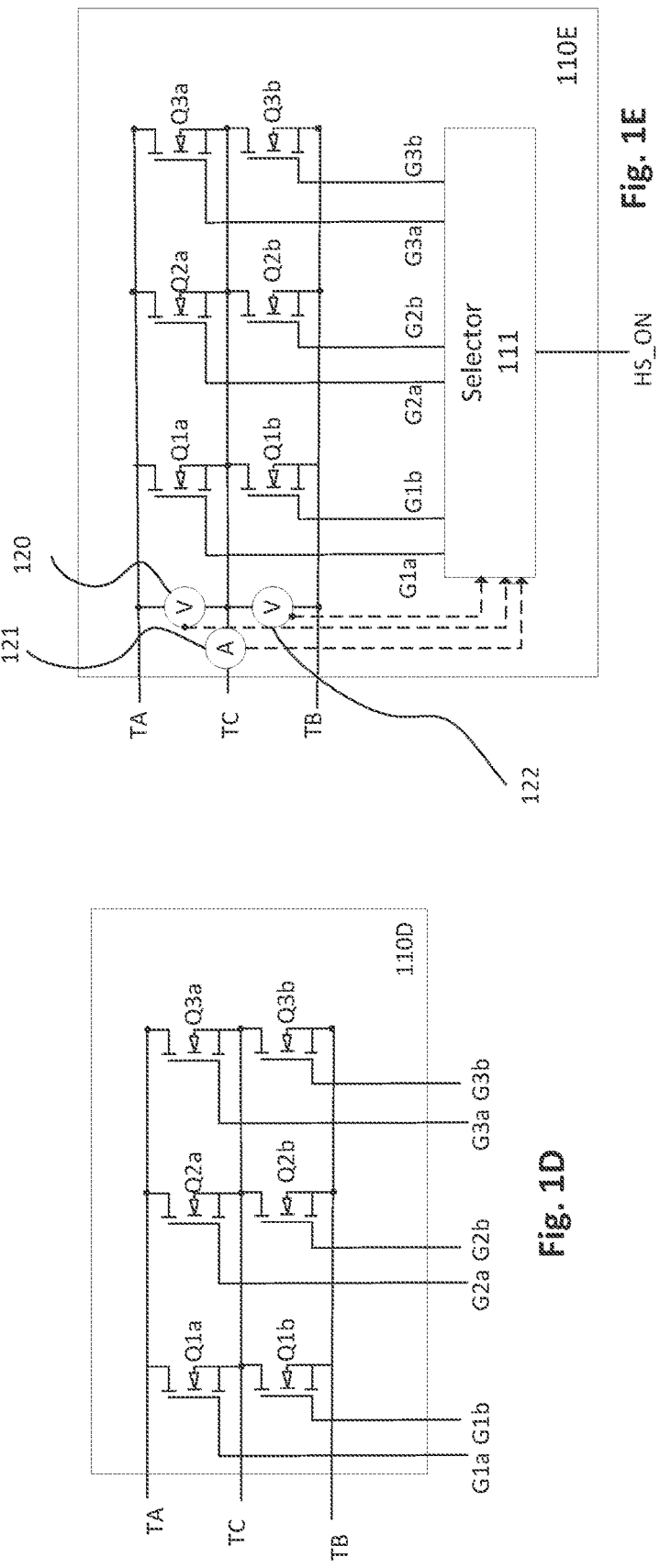

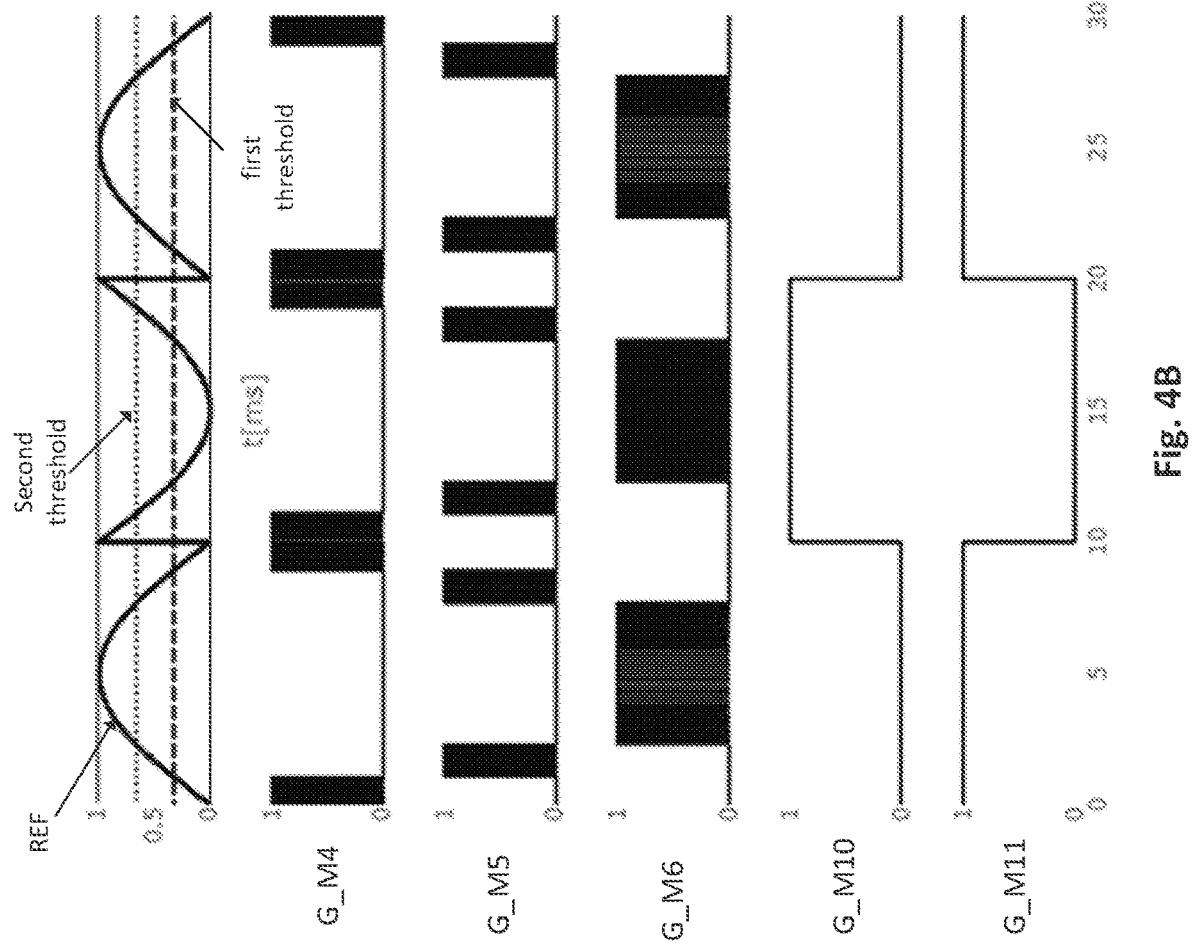

US 11,677,307 B2

METHOD AND APPARATUS FOR EFFICIENT SWITCHING

CROSS-REFERENCE TO RELATED APPLICATIONS

The present application claims priority to U.S. Provisional Patent Application No. 63/060,312, filed Aug. 3, 2020. The contents of the above identified application are incorporated herein by reference in its entirety.

BACKGROUND

Switching losses and conduction losses are significant loss factors for switching in semiconductor switching devices. In constructing semiconductor switches, there is often a tradeoff between designing a switch for low switching losses and designing a switch for low conduction losses. A switch having characteristics designed to achieve low switching losses may, in exchange, incur high conduction losses, and vice-versa: a switch having characteristics designed to achieve low conduction losses may, in exchange, incur high switching losses.

SUMMARY

The following presents a simplified summary in order to provide a basic understanding of some aspects of the disclosure. The summary is not an extensive overview of the disclosure. It is neither intended to identify key or critical elements of the disclosure nor to delineate the scope of the disclosure. The following summary merely presents some concepts of the disclosure in a simplified form as a prelude to the description below.

Aspects of the disclosure provide effective, efficient, and convenient technical solutions that address and overcome the technical problems associated with efficient switching in semiconductor switching devices.

Systems, apparatuses, and methods are described for a switching device. The switching device may comprise two or more switches, with at least two switches differing from one another in one or more electrical parameters. The switching device may be controlled by a controller configured to selectively operate one or more of the switches depending on a voltage signal. The controller may be further configured to operate two or more switches from the switching device at different frequencies. The controller may be further configured to operate two or more switches from the switching device at different times, depending on a voltage signal.

These features, along with many others, are described in greater detail below.

BRIEF DESCRIPTION OF THE DRAWINGS

The present disclosure is illustrated by way of example and is not limited in the accompanying figures in which like reference numerals indicate similar elements and in which:

FIGS. 1B-1G show examples of switch arrangements and modules that may be used for efficient switching in accordance with one or more example embodiments; the present disclosure

FIG. 4B shows example waveforms associated with a power converter that may be used for efficient switching in accordance with one or more example embodiments;

DETAILED DESCRIPTION

Figure 1A:
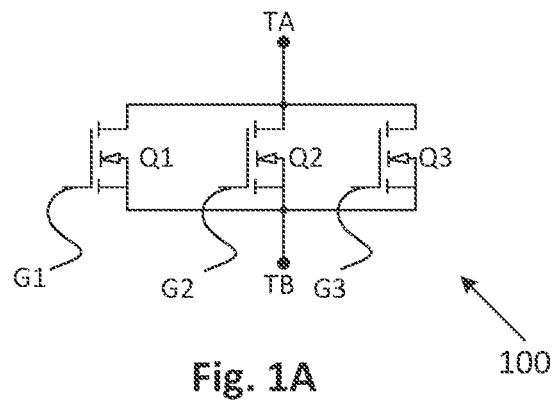
FIG. 1A shows an example of a switch arrangement for efficient switching in accordance with the present disclosure

The accompanying drawings, which form a part hereof, show examples of the disclosure. It is to be understood that the examples shown in the drawings and/or discussed herein are non-exclusive and that there are other examples of how the disclosure may be practiced.

As discussed above, switching arrangements that may increase efficiency of power devices are disclosed herein. Connecting multiple switches in parallel may enable selecting a switch for operation, and operating the selected switch (e.g., turning the selected switch ON and OFF at a certain frequency) for a portion of time based on the electrical characteristics of the switches. For example, one of the switches may be better suited for operation at high frequency (e.g., being turned ON and OFF hundreds of thousands of times per second), and one of the switches may be better suited for carrying a large current (e.g., tens or hundreds of amperes).

The switch arrangements described herein may be used to efficiently reduce losses (e.g., conduction and switching losses) in applications such as solar inverters configured to output an alternating current (AC) voltage. For example, a switch arrangement according to the disclosure herein may include a first switch having characteristics (e.g., low conductance resistance) favorable for switching during a period of time corresponding to a peak of a sine wave output of a solar inverter, and a second switch having characteristics (e.g., low switching loss) favorable for switching during a period of time corresponding to a rapid change in the sine wave output of the solar inverter. Additional applications may include other types of inverters (e.g., inverters for motor drives, air conditioning units, Uninterruptable Power Supply units), and alternating current to direct current (AC/DC) rectifiers used, for example, to rectify power output by wind turbines, or the power grid, or other AC sources.

Reference is now made to FIG. 1A, which shows an example of a switch arrangement 100 that may be used for efficient switching in accordance with one or more aspects described herein. The switch arrangement 100 shown in FIG. 1A comprises a first switch Q1, a second switch Q2 and a third switch Q3. Switches Q1, Q2 and Q3 are connected in parallel between terminals TA and TB. Switches Q1-Q3 are shown as Metal Oxide Semiconductor Field Effect Transistors (MOSFETs), but may also be different types of semiconductor switches, such as Bipolar Junction Transistors (BJTs), Gallium Nitride transistors (GaNs), Silicon Carbide switches (SiCs), Insulated Gate Bipolar Transistors (IGBTs), etc. As may be depicted in switch arrangement 100 using MOSFETs, terminal TA may be connected to drain terminals of each of switches Q1-Q3, and terminal TB may be connected to source terminals of each of switches Q1-Q3. Each of switches Q1-Q3 may feature a gate terminal, denoted G1-G3, respectively, provided for controlling the respective switch: switch Q1 may be controlled via gate terminal G1, switch Q2 may be controlled via gate terminal G2, and switch Q3 may be controlled via gate terminal G3.

Terminals TA or TB may be used as drain or source terminals for all three switches Q1-Q3. Terminals TA or TB may be mechanically designed to be connected in a power circuit, such as in the same manner that a single switch would have drain or source terminals connected to the power circuit. Each switch may be mechanically attached to a power circuit (e.g., separately). Each switch source or drain terminal may be mechanically designed to be attached to a circuit.

A controller may be configured to selectively (such as according to a method described herein) apply a voltage (such as via a gate driver, not explicitly depicted in figures herein) to one of gate terminals G1-G3, which may cause the corresponding switch to turn ON. In some cases, the switches may be, by default, in the ON position, in which case the controller may be configured to selectively apply a voltage to one of gate terminals G1-G3, which may cause the corresponding switch to turn OFF.

Figure 1B:
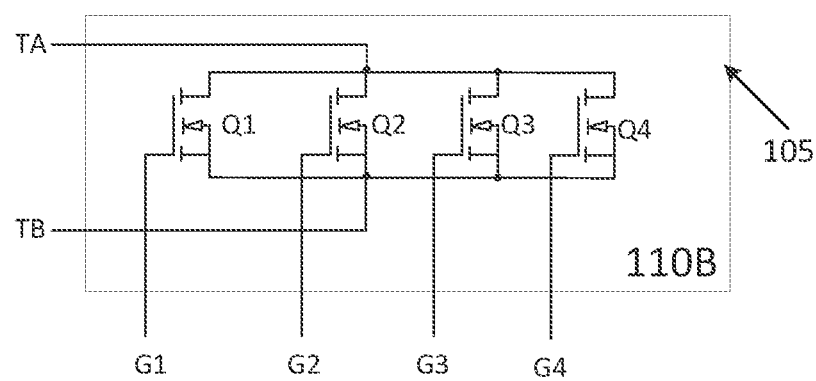

Reference is now made to FIG. 1B, which shows an example of a switch module 110B that may be used for efficient switching in accordance with one or more aspects described herein. Switch module 110B comprises four switches Q1-Q4, which may be packaged and integrated together in a single module housing 105. As shown in this example, various numbers of switches (e.g., other than three) may be used to implement an efficient switching module. Switch Q4 may be similar to switches Q1-Q3, but may feature a different electrical parameter (e.g., parasitic capacitance values, conduction resistance [Rds_on], etc.) than one or more of the other switches Q1-Q3. Terminals TA or TB may be externally provided (e.g., provided as terminals accessible from outside the module) as power terminals, and/or terminals G1-G4 may be provided externally as control terminals, which may enable an external controller to control switches Q1-Q4. Terminals TA or TB may be viewed as common conduction path terminals for switches Q1-Q4, as terminals TA or TB may, for example, conduct current regardless of which switch is ON at any particular time. Internal connections between the switches (e.g., solder, wires or bus bars connecting the switches in parallel) may be internal to the module housing 105 and might not be externally accessible. Arranging switches Q1 and Q2, or all of Q1-Q3 in an integrated housing, or arranging switches Q1-Q4 in an integrated housing, may have the advantage of enabling efficient cooling and packaging of the switches while enabling efficient control and operation of the switches in accordance with one or more aspects described herein.

Referring now to FIG. 1C, it is to be understood that multiple switch arrangements similar to or incorporating switch arrangement 100 may be integrated into a single switch module. For example, a single switch module 110C may include four switches divided into two pairs of switches similar to Q1-Q2 of FIG. 1A, wherein each pair may be connected in parallel. As shown in FIG. 1C, a power module may feature two power terminals TA1 and TB1 and two control terminals G1a and G2a for the first switch pair comprising Q1a and Q2a. A power module may feature two additional power terminals TA2 and TB2, and two additional control terminals G1b and G2b for the second switch pair comprising Q1b and Q2b. Switches Q1a and Q2a may differ from one another in at least one electrical parameter. Switches Q1b and Q2b may differ from one another in at least one electrical parameter.

Referring now to FIG. 1D, it is to be understood that multiple interconnected switch arrangements similar to or incorporating switch arrangement 100 may be integrated into a single switch module. For example, switch module 110D may include two groups of three switches connected in parallel. In FIG. 1D, a first switch group may be comprised of switches Q1a-Q3a connected in parallel, and a second switch group may be comprised of switches Q1b-Q3b connected in parallel. The first switch group may be connected between terminals TA and TC. The second switch group may be connected between terminals TC and TB. A switch module may contain a number of power terminals and may contain a number of control terminals, wherein in some variations, the number of control terminals corresponds to the number of switches. For example, a switch module may feature 3 power terminals (TA, TC and TB) and 6 control terminals (one for each switch). While FIG. 1D contains 3 power terminals and 6 control terminals, a single switch module may contain more than 3 power terminals and/or more than 6 control terminals. Additionally or alternatively, while FIG. 1D contains 3 power terminals and 6 control terminals, a single switch module may contain less than 3 power terminals and/or less than 6 control terminals.

In some cases, as shown in FIG. 1D, a first trio may be configured to operate in a substantially complementary manner with a second trio. For example, a first trio of switches (e.g., Q1a-Q3a) may be configured to be high-side switches in a half bridge circuit, and a second trio of switches (e.g., Q1b-Q3b) may be configured to be low-side switches in a half bridge circuit. Each switch in the first trio of switches may be operated to be OFF when the corresponding switch of the second trio of switches is ON. Additionally or alternatively, each switch in the second trio of switches may be operated to be OFF when the corresponding switch of the first trio of switches is ON.

In some variations, the number of control terminals may correspond to the number of switches. For example, six control terminals (e.g., G1a-G3a and G1b-G3b) may be provided by the switch module (e.g., as may be shown in FIG. 1D), wherein each control terminal controls a corresponding switch. Each complementary switch pair (e.g., Q1a, Q1b) might not be fully complementary. For example, when Q1a is ON then Q1b may be OFF, and vice versa. It is also possible that both Q1a and Q1b may be OFF at the same time (e.g., when a different complementary switch pair is being used). Additionally or alternatively, both Q1a and Q1b may be ON at the same time (e.g., when it may be desirable to directly connect terminals TA and TC).

In some implementations, the control signals provided for the controlling switches (e.g., G1a-G3a and G1b-G3b) may be provided by analog hardware logic circuits. In some implementations, the control signals may be generated by digital hardware or software, and may be provided by a digital controller.

Reference is now made to FIG. 1E, which shows an integrated switch module for efficient switching in accordance with one or more aspects described herein. Switch module 110E may include switches Q1a-Q3a and Q1b-Q3b, as arranged in FIG. 1D. Voltmeter 120 may measure voltage between terminals TA and TC. Voltmeter 122 may measure voltage between terminals TC and TB. Ammeter 121 may measure current flowing through terminal TC. In some implementations, additional voltmeters and/or ammeters may be used. For example, a voltage sensor between terminal TC and a terminal of a different circuit (not shown in FIG. 1E) may be used. Voltmeters 120 and 122, ammeter 121, and additional voltmeters and/or ammeters may be collectively referred to as "sensors". Selector 111 may be integrated in switch module 110E and may receive voltage and current measurements from voltmeter 120, voltmeter 122, ammeter 121, or additional measurement devices.

Selector 111 may be configured to receive an external control signal (e.g., HS_ON). Based on receiving the HS_ON signal and the current and/or voltage values measured by the sensors, selector 111 may control one or more of the switches (e.g., Q1a-Q3a and Q1b-Q3b) to be ON, and may control the one or more of the remaining switches to be OFF. For example, when the voltage between TA and TB is relatively high in magnitude, but is varying relatively slowly (e.g., near the peak of a sine wave voltage), and/or the current measured by ammeter 121 is relatively high in magnitude, selector 111 may alternate (e.g., by a PWM switching scheme, such as at a relatively low frequency) the state of two switches (e.g., Q1a and Q1b). Alternating the state of the switches may be characterized by low-conduction-loss performance such that the state of Q1a tracks the external control signal (e.g., the HS_ON signal) and the state of Q1b is always the opposite of the external control signal (e.g., the HS_ON signal). Selector 111 may leave the other switches (e.g., Q2a, Q2b, Q3a, Q3b) OFF.

When the voltage between terminals TA and TB is relatively low in magnitude, but is changing relatively rapidly (e.g., the voltage tracks a sine wave, and is near a zero-crossing of the sine wave), selector 111 may alternate (e.g., by a PWM switching scheme at a relatively high frequency) the state of two switches (e.g., Q3a and Q3b) characterized by low-switching-loss performance and leave the other switches (e.g., Q1a, Q1b, Q2a, Q2b) OFF.

Selector 111 may be a digital controller that may be configured to receive external control signals (e.g., an HS_ON signal) and sensor measurements via input ports, and may be configured to control switches (e.g., Q1a-Q3b) via digital output signals (e.g., as provided by selector 111 to gate drivers connected to the corresponding gate terminals G1a-G3b). Selector 111 may comprise an analog or mixed-signal control circuit.

For example, selector 111 may be configured to turn one of Q1a, Q2a, and Q3a ON when the HS_ON signal is "high" (e.g., a logical 1' signal is received on a HS_ON input line). Selector 111 may be configured to select one or more of Q1a, Q2a and Q3a to turn ON based on current and/or voltage measurements indicating an operating point of switch module 110E. When the HS_ON signal is 'low' (e.g., a logical '0' signal is received on a HS_ON input line), selector 111 may be configured to set all of Q1a-Q3a to OFF, and at least one of one of switches Q1b, Q2b and Q3b to ON.

It is appreciated that modules integrating switch arrangements in accordance with one or more aspects described herein may include two or more groups, and that each group may include two or more switches having at least one different electrical parameter. For example, multiple circuits corresponding to switch arrangements and/or modules 110A-110E may be packaged together as a single module.

Figure 1F:
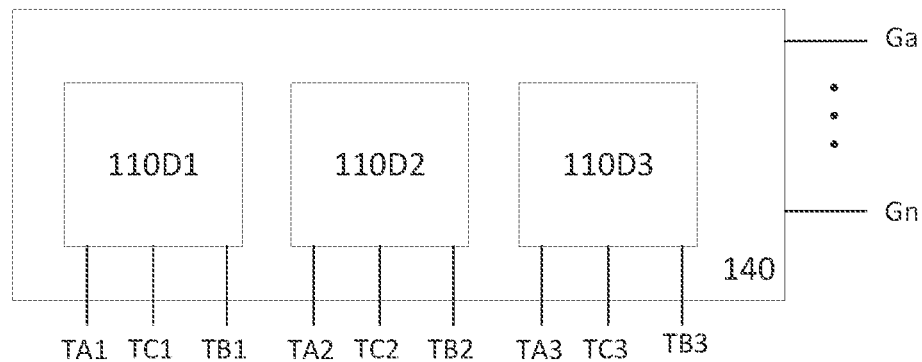

Reference is now made to FIG. 1F, which shows a switch module for efficient switching in accordance with one or more aspects described herein. Switch module 140 may include a number of switch modules (e.g., switch modules 110D1, 110D2, and 110D3), each of which may be similar to or may incorporate switch module 110D of FIG. 1D. In some variations, switch module 140 may include two switch modules (e.g., 110D1 and 110D2) that are controlled to implement a full-bridge inverter. For example, a first switch module (e.g., 110D1) may be controlled (e.g., via one or more of gate inputs Ga-Gn) to receive a first input voltage between terminals TA1 and TB1, and may output a first output voltage between terminals TC1 and TB1, or between terminals TC1 and TA1. A second switch module (e.g., 110D2) may be controlled to receive a second input voltage between terminals TA2 and TB2, and may output a second output voltage between terminals TC2 and TB2, or between terminals TC2 and TA2. In some variations, the second input voltage may be the same as the first input voltage (e.g., terminals TA1 and TB1 may be connected to terminals TA2 and TB2, respectively). The second output voltage may be controlled such that a differential voltage between terminals TC1 and TC2 may form a sine wave. For example, the firm output voltage at terminal TC1 may form a unipolar sinewave shape form with respect to terminal TB1, and the second output voltage at terminal TC1 may be similar to the first output voltage, but phase shifted by 180 degrees, to form a bipolar sine wave between terminals TC1 and TC2.

All three switch modules 110D1-110D3 may be controlled to output three sine wave voltages at 120-degree phases shifts with respect to one another, which may form a three-phase inverter output.

Figure 1G:
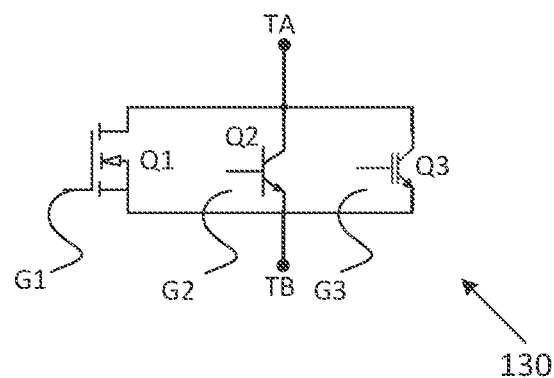

Reference is now made to FIG. 1G, which shows a switch arrangement for efficient switching in accordance with one or more aspects described herein. Switch arrangement 130 may feature a number of switches (e.g., Q1, Q2 and Q3) and may be implemented using different switch types. For example, switch Q1 of switch arrangement 130 may be implemented using a MOSFET, switch Q2 of switch arrangement 130 may be implemented using a Bipolar Junction Transistor (BJT), and switch Q3 of switch arrangement 130 may be implemented using an Insulated Gate Bipolar Transistor (IGBT). This is for example purposes only, and any other suitable implementation may be used (e.g., GaN transistors, SiC MOSFETs, etc.). Switch Q1 may be PWM-switched during a first time period corresponding to a time when a sine wave changes rapidly, which may take advantage of superior switching characteristics of a MOSFET. Switch Q3 may be PWM-switched during a third time period corresponding to a time when a sine wave changes slowly and may conduct high current, which may take advantage of superior conduction characteristics of an IGBT. Switch Q2 may be PWM-switched during a second time period corresponding to a time when a sine wave changes at a medium rate and may conduct a medium current level, which may take advantage of the switching loss—conduction loss balance of the BJT.

Figure 2A:
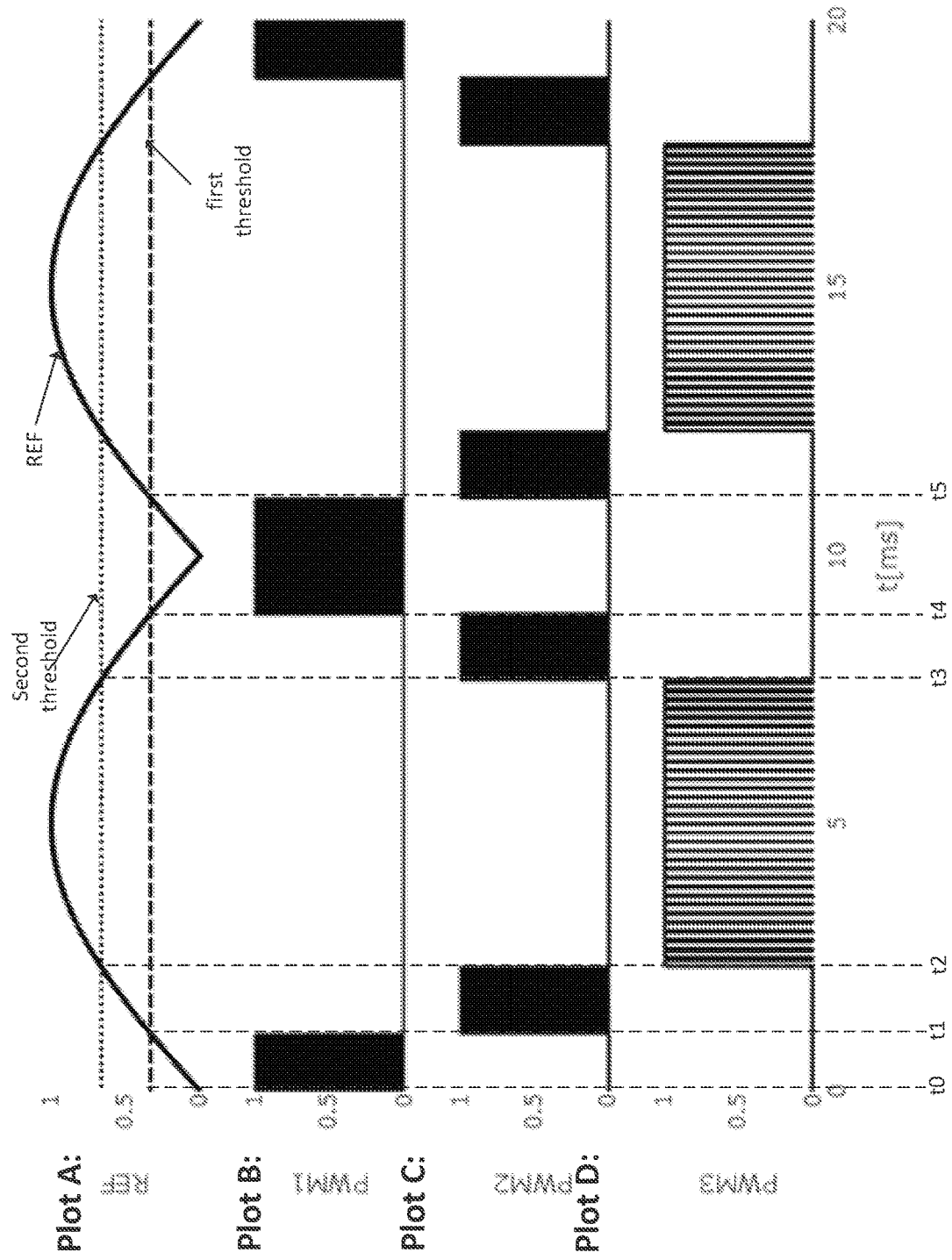
FIGS. 2A-2E show example waveforms showing operation of switch arrangements that may be used for efficient switching in accordance with the present disclosure.

Reference is now made to FIG. 2A, which shows waveforms that may be measured when operating within switch arrangement 100 of FIG. 1A, in accordance with one or more aspects described herein. Plot A displays a rectified sinusoid reference signal (e.g., REF), which oscillates between values 0 and 1 (i.e., REF(x)=|sin(x)|). A rectified sinusoid reference signal may be used, for example, for operating switches in a two-stage inverter circuit. For example, the first stage may comprise a DC/DC converter configured to output a rectified sine wave voltage, and a second stage may comprise a low frequency unfolding bridge configured to convert the rectified sine wave output by the first stage to a bipolar sine wave output. A rectified sinusoid reference signal may also be used, for example, for operating switches in a two-stage rectifier circuit. For example, the first stage may comprise a low frequency unfolding bridge configured to receive a sine wave input and to output a rectified sine wave (e.g., that can be used as the REF signal or to create a similarly shaped REF signal), and the second stage may comprise a DC/DC converter configured to convert the rectified sine wave voltage to a substantially constant DC voltage.

A reference signal (e.g., REF) may be a reference signal created in hardware or software, and may provide an indication, to the controller, of what voltage should be output by a converter including switches (e.g., Q1-Q2). Additionally or alternatively, the REF signal may provide an indication of a desirable duty cycle for a PWM-controlled switch of a converter. In some embodiments, reference signal REF may be based on a measured value. For example, in a rectifier circuit, REF may correspond to a measured input voltage. REF may indicate to the controller when a switch from switch arrangement 100 should be ON in order to rectify the received input voltage. In some variations, an inverter circuit may be coupled to an AC grid and the REF signal may correspond to a measured grid voltage connected at the inverter output. In some embodiments, an inverter circuit may operate in off-grid mode (e.g., when not connected to an externally imposed AC voltage) and the REF signal may be based on a stored value (e.g., a value stored in an internal memory device) or on an internal reference signal generator.

As indicated in FIG. 2A, a first threshold may be indicated by a dashed line having a constant value of about 0.333, and a second threshold may be indicated by a dotted line having a constant value of about 0.666, dividing the value range of the reference signal REF into three portions:

a. Portion 1: 0<REF <0.333
b. Portion 2: 0.333<REF <0.666
c. Portion 3: 0.666<REF <1

It is appreciated that using a single threshold may divide the value range of the reference signal REF into two portions. Additional thresholds may divide the REF signal value range into more than three portions. For example, four thresholds may be used to divide the REF signal value range into five portions. The portions need not be equal in size, and the REF signal may be in one portion for a longer period of time than in another portion.

For illustrative purposes, a switch Q1 (which may be a switch Q1, Q1a, or Q1b as described herein) may be characterized by electrical parameters resulting in low switching losses (e.g., low parasitic capacitance values, such that a reduced amount of energy is needed to charge and discharge the capacitors turning switch turn-on and turn-off), but high conduction losses (e.g., increased Rds_on), a switch Q3 (which may be a switch Q3, Q3a, or Q3b as described herein) may be characterized by electrical parameters resulting in high switching losses (e.g., large parasitic capacitance values), but low conduction losses (e.g., low Rds_on), and a switch Q2 (which may be a switch Q2, Q2a, or Q2b as described herein) may be characterized by electrical parameters resulting in medium switching losses (e.g., medium parasitic capacitance values) and medium conduction losses (e.g., medium Rds_on).

A controller configured to control switches (e.g., Q1-Q3) may be configured to operate (e.g., switch between ON and OFF) switch Q1 at a first frequency when the REF signal is below a first threshold (e.g., is changing rapidly), corresponding to a time period between t0 and t1. When the controller operates switch Q1, switches Q2 and Q3 may be held OFF by the controller. The controller may be configured to operate switch Q3 at a third frequency when the REF signal is above the second threshold (e.g., changing slowly), corresponding to a time period between t2 and t3. When the controller operates switch Q3, switches Q2 and Q1 may be held OFF by the controller. The controller may be configured to operate switch Q2 at a second frequency when the REF signal is between the first and second thresholds (e.g., changing at a medium rate), corresponding to a time period between t1 and t2.

The first frequency may be higher than the second frequency, and the second frequency may be higher than the third frequency. During the first time period, when the reference signal REF is changing rapidly, the controller may operate the first switch at the first frequency, (e.g., a high frequency, which may be 50 kHz) to enable fast tracking of the reference signal. This may have the advantage of allowing Q1's superior switching loss characteristics to avoid incurring substantial switching losses.

In some variations, the first time period may correspond to a time when the first current flowing through the switching device is low (e.g., during a zero-crossing of an inverter current that substantially tracks an inverter voltage, such as operation at a low displacement factor [also known as cosφ]), which may have the advantage of reducing excessive losses caused by Q1's inferior conduction loss properties. During the third time period, when Q3 may be operated and switches Q1 and Q2 may be kept OFF, a third current (e.g., high current) may be conducted by Q3, corresponding to the high voltage level indicated by the REF signal. The third current may be greater than the first current. However, because of Q3's superior conduction characteristics, conduction losses may be reduced. Since the REF signal may change relatively slowly during the third time period, the controller may control switch Q3 at a relatively low switching frequency (e.g., 10 kHz or less) to avoid incurring substantial switching losses caused by Q3's inferior switching properties. Switch Q2 may be operated in the second time period at, for example, 25 kHz, where a second current (e.g., an intermediate current) may flow through the switching device, which may result in a second rate of change of the reference signal REF (e.g., an intermediate rate of change) and may provide a balance between switching losses and conduction losses. The second current may be greater than the first current, but may be less than the third current.

Referring to FIG. 2A, Plot B depicts an example logical signal (e.g., PWM1) applied to a switch (e.g., Q1) when a controller is controlling a number of switches (e.g., Q1-Q3), in accordance with one or more aspects of described herein. When Q1 is operated, a PWM signal (e.g., PWM1) may be applied to the gate of Q1, which may turn switch Q1 ON when the PWM signal is high (e.g., a logical '1') and may turn switch Q1 OFF when the PWM signal is low (e.g., a logical '0'). When switches Q2 or Q3 are being operated, switch Q1 may always be OFF (e.g., the control signal provided by the controller to the gate of switch Q1 may always be low).

Plot C depicts an example signal applied to a switch (e.g., Q2) when a controller is controlling a number of switches (e.g., Q1-Q3), in accordance with one or more aspects described herein. As shown in Plot C, an example logical signal (e.g., PWM2) may be applied to a switch (e.g., Q2) when a reference signal REF is above a first threshold and below a second threshold. The frequency of PWM2 may be lower than the frequency of PWM1.

Plot D depicts an example signal applied to a switch (e.g., Q3) when a controller is controlling a number of switches (e.g., Q1-Q3), in accordance with one or more aspects described herein. When switch Q1 is being operated, switches Q2 and Q3 may always be OFF. When switch Q2 is being operated, switches Q1 and Q3 may always be OFF. When switch Q3 is being operated, switches Q2 and Q1 may always be OFF.

Figure 2B:
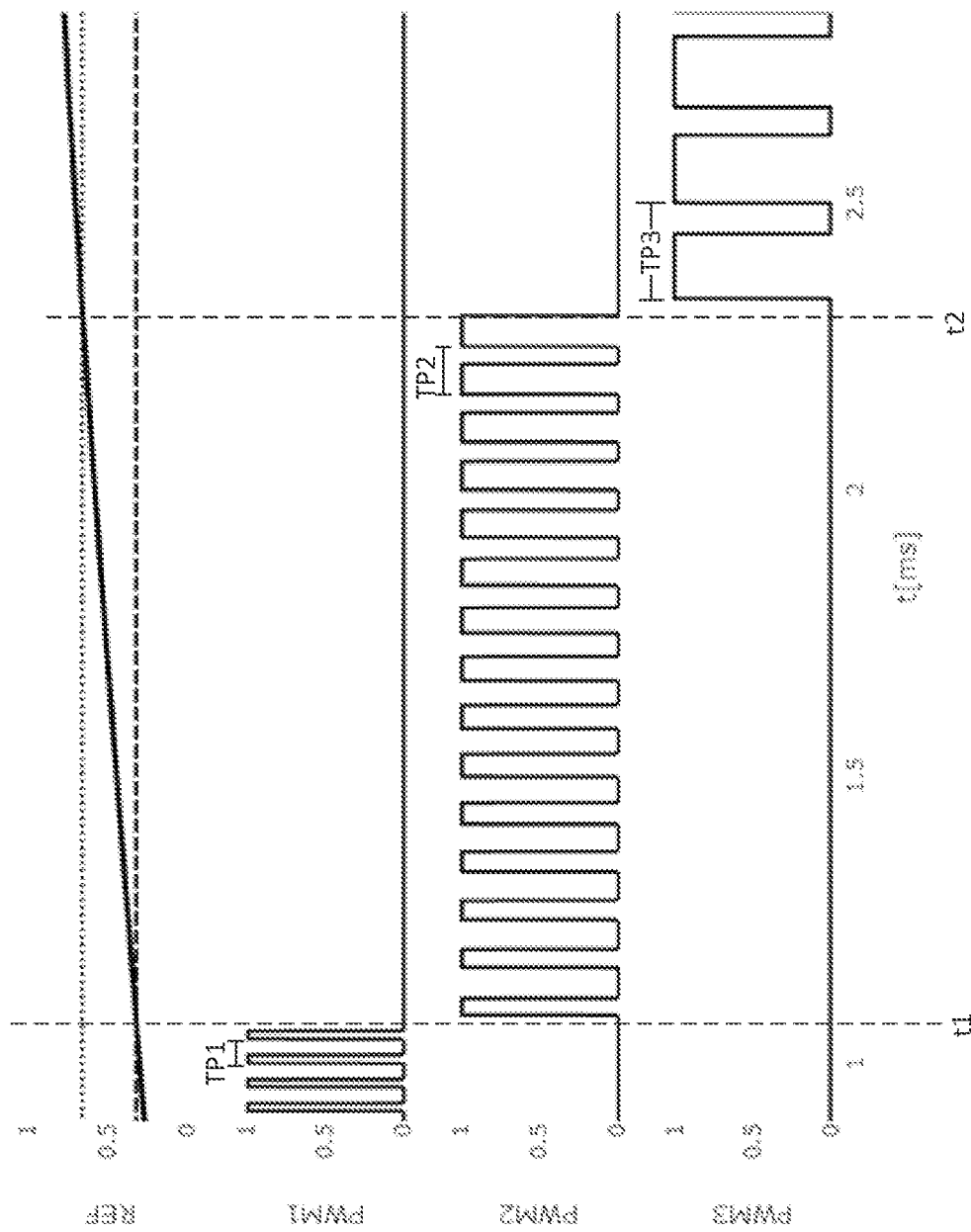

Reference is now made to FIG. 2B, which shows a zoomed-in portion of the waveforms of FIG. 2A. In the illustrative example depicted in FIG. 2B, switch Q1 may switch at 24 kHz when in PWM mode, switch Q2 may switch at 12 kHz when in PWM mode, and switch Q3 may switch at 6 kHz when in PWM mode. Hence, in this example, period TP1 (e.g., the time between rising edges of consecutive pulses of Q1) is $$\frac{1}{24000 \text{ Hz}} = 41.6 \text{ μs},$$

period TP2 (e.g., the time between rising edges of consecutive pulses of Q2) is $$\frac{1}{12000 \text{ Hz}} = 83.3 \text{ μs},$$

and period TP3 (e.g., the time between rising edge of consecutive pulses of Q3) is $$\frac{1}{6000 \text{ Hz}} = 166.7 \text{ μs}.$$

Figure 2C:
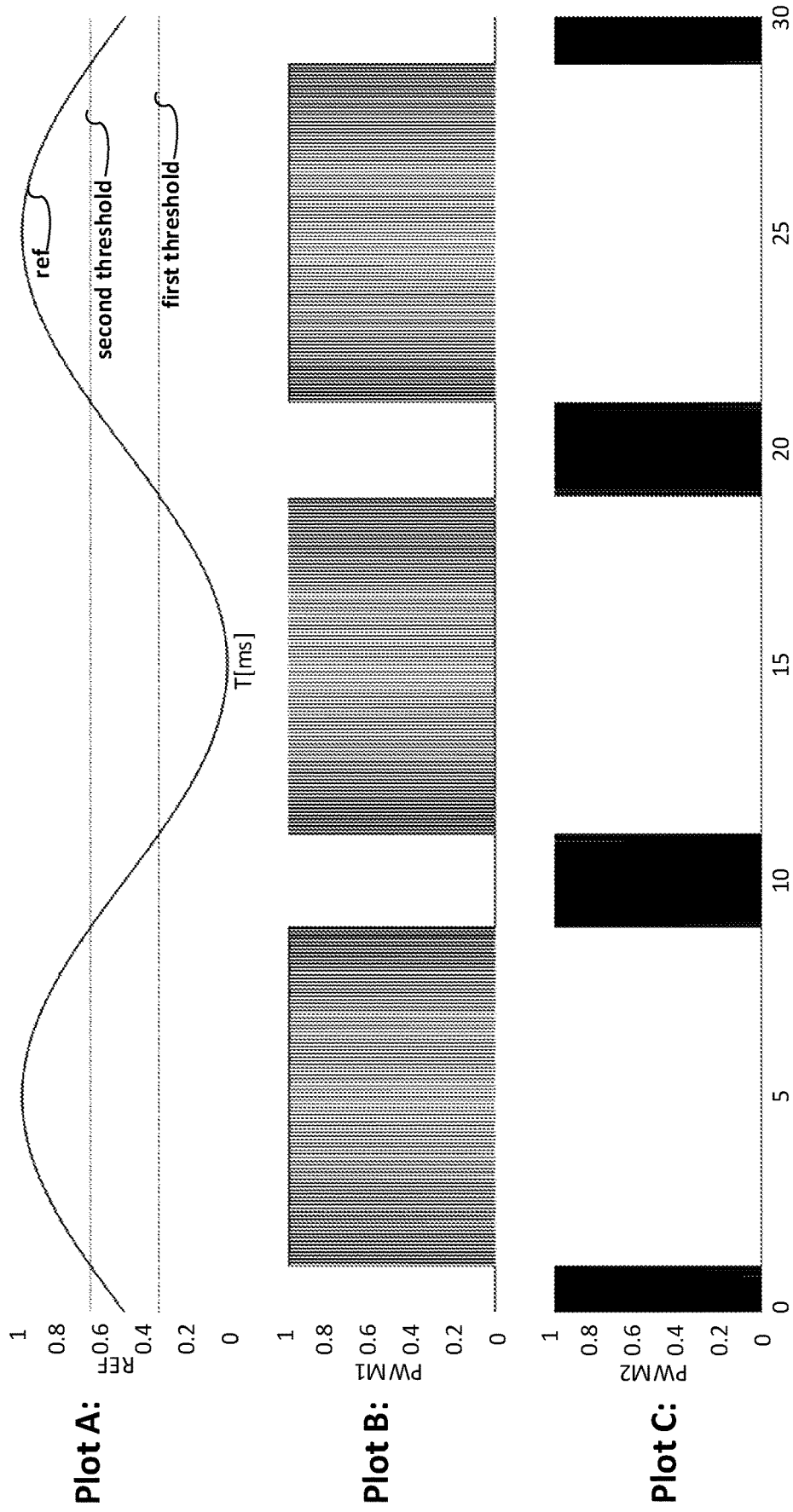

Reference is now made to FIG. 2C, which shows waveforms that may be measured when operating a switching device similar to or incorporating those shown in FIGS. 1A-1G, in accordance with one or more aspects described herein. Plot A displays a reference signal REF oscillating as a positive sinusoid $$\left(\text{i.e, } REF(x) = \frac{\sin(x) + 1}{2}\right),$$

between values 0 and 1. This type of reference signal may be used as part of a two-leg rectifier/inverter circuit. The first leg may be configured to output (in the inverter case), or receive as input (in the rectifier case), a voltage signal similar to REF(x) as described above. The second leg may comprise a half bridge configured to selectively provide a negative bias such that a sine wave is obtained between the two legs.

First and second thresholds of 0.333 and 0.666, respectively, may divide the reference signal period into three portions:
 a. Portion 1: 0<REF <0.333
 b. Portion 2: 0.333<REF <0.666
 c. Portion 3: 0.666<REF <1

During portion 2, a first switch (whose operation is depicted in Plot C), characterized by having low switching losses, may be operated at a first, high frequency. During portions 1 and 3, a second switch (whose operation is depicted in Plot B), characterized by having low conduction losses, may be operated at a second, low frequency.

The first switch may be a switch Q1, Q1a, or Q1b as depicted herein, and the second switch may be a switch Q2, Q2a, or Q2b as discussed herein. Switch Q3 may be unused, or might not be included in the circuit. Alternatively, the second switch may be a switch Q3, Q3a, or Q3b (e.g., switch Q2 may be unused or absent).

Figure 2D:
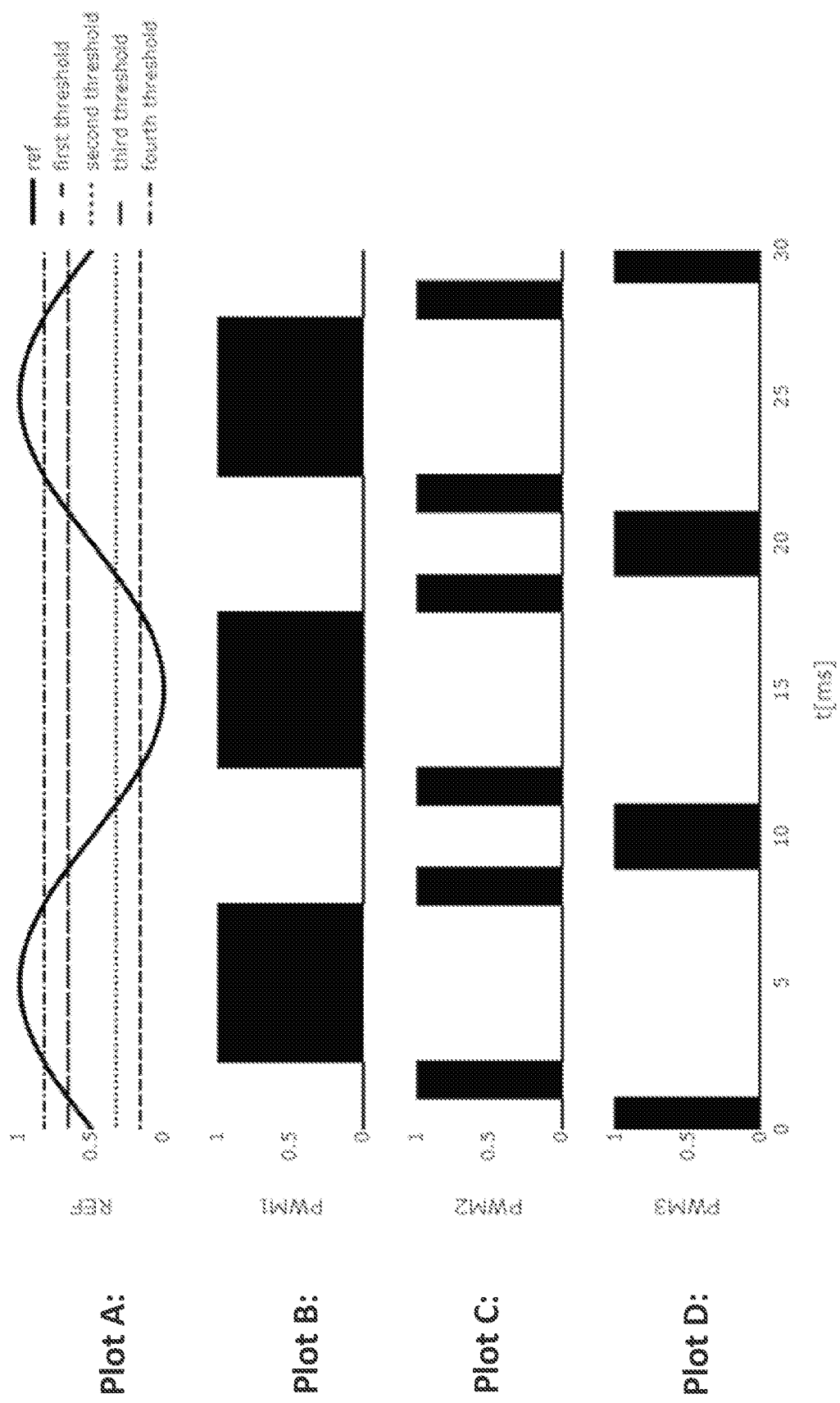

Reference is now made to FIG. 2D, which shows waveforms that may be measured when operating three switches (e.g., the switching device of FIG. 1A), in accordance with one or more aspects described herein. Plot A displays a reference signal REF oscillating as a positive sinusoid, similar to the REF signal of FIG. 2C. Plots B-D show PWM signals used to control the three switches.

Four thresholds may be used to determine which switch of a switching device should be used, wherein the value of the first, second, third, and fourth thresholds may be 0.166, 0.333, 0.666, and 0.833, respectively. The four thresholds may divide the reference signal period into five portions:
 a. Portion 1: 0<REF <0.166
 b. Portion 2: 0.166<REF <0.333
 c. Portion 3: 0.333<REF <0.666
 d. Portion 4: 0.666<REF <0.833
 e. Portion 5: 0.833<REF <1

During a time portion when the REF signal is changing slowly (e.g., portions 1, 5), a first switch optimized for low conduction losses may be switched at a relatively low frequency. During a time portion when the REF signal is changing rapidly (e.g., portion 3), a third switch optimized for low switching losses may be switched at a relatively high frequency. During a time portion when the REF signal is changing at a medium pace (e.g., portions 2, 4), a second switch designed for medium switching losses and medium conduction losses may be switched at an intermediate frequency.

Figure 2E:
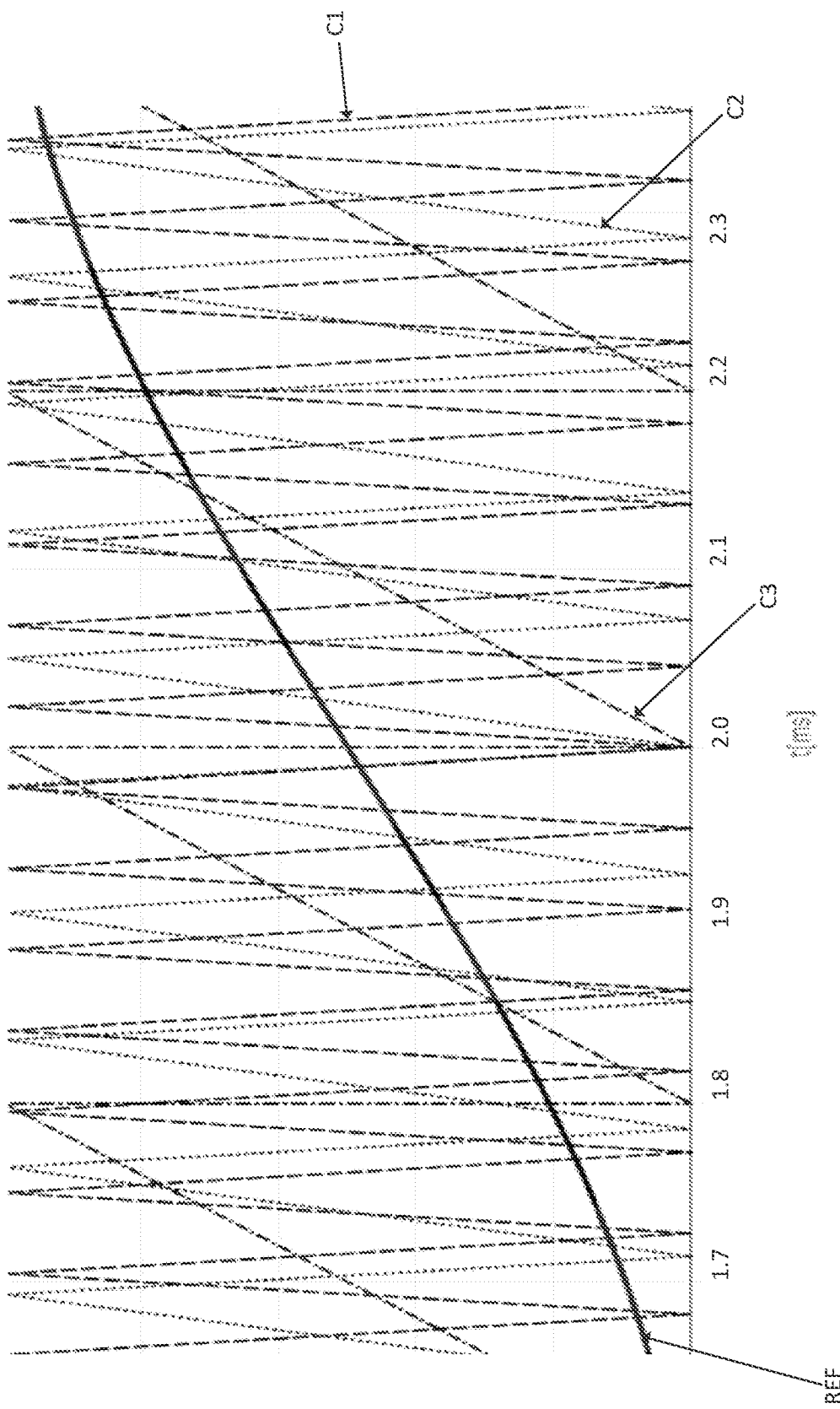

Reference is now made to FIG. 2E, which shows carrier waves that may be used to generate control signals for arrangements of parallel-connected switches for efficient switching, in accordance with one or more aspects described herein. Carrier wave C1 (indicated by a dashed line) may form a first triangular waveform that oscillates between 0 and 1 at a first frequency of 22 kHz. Carrier wave C2 (indicated by a dotted line) may form a second triangular waveform that oscillates between 0 and 1 at a second frequency of 14 kHz. Carrier wave C3 (indicated by a dash-dot line) may form a third triangular waveform that oscillates between 0 and 1 at a third frequency of 5 kHz. When a first switch (e.g., a switch Q1, Q1a, or Q1b) is in PWM mode (e.g., between times t1 and t2 of FIG. 2A), reference signal REF may be compared (e.g., in hardware or software) to carrier wave C1. When the value of reference signal REF is greater than the value of carrier wave C1, the first switch may be turned ON. Additionally or alternatively, when the value of reference signal REF is less than the value of carrier wave C1, the first switch may be turned OFF. Similarly, when a second switch (e.g., a switch Q2, Q2a, or Q2b) or a third switch (e.g., a switch Q3, Q3a, or Q3b) are in PWM mode, reference signal REF may be compared to carrier waves C2 and C3, respectively.

Figure 3:
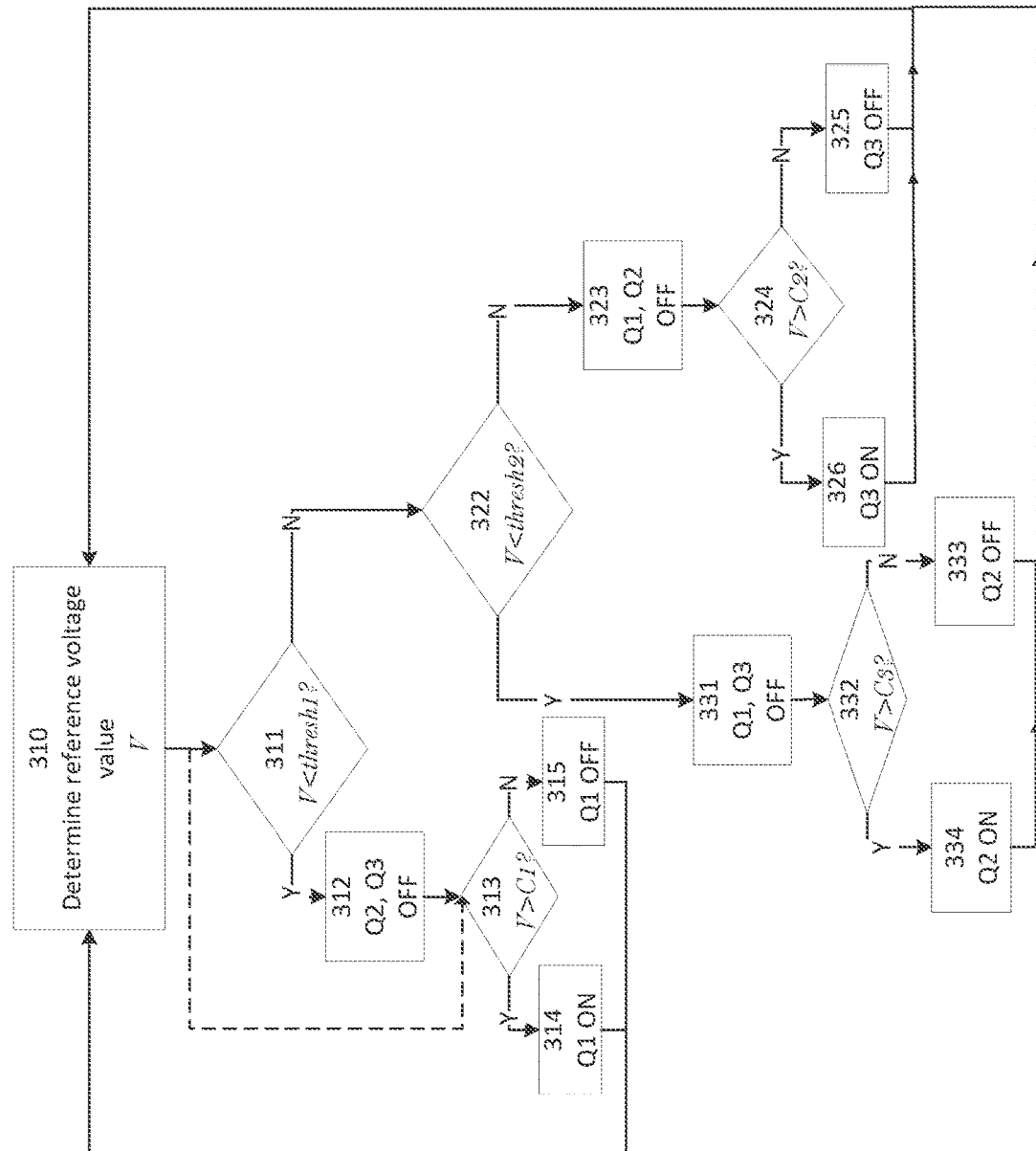
FIG. 3 shows an example method for operating a switch arrangement for efficient switching in accordance with the present disclosure.

Reference is now made to FIG. 3, which shows one example method for operating a switch arrangement for efficient switching in accordance with one or more aspects described herein. Method 300 illustrates an example method for operating a number of parallel-connected switches (e.g., Q1-Q3 of FIGS. 1A-1B, or Q1a-Q3a of FIGS. 1D-1E). Method 300 may be carried out by a controller (e.g., a digital or analog control circuit, a processor, ASIC, etc.) providing control signal to gate drivers configured to drive (e.g., turn ON and OFF) the parallel-connected switches.

At step 310, the controller may determine a reference voltage value (e.g., V). The controller may determine V by sampling a reference voltage signal. The reference voltage signal may be generated internally (e.g., in the controller or in a power device comprising the controller). Additionally or alternatively, the reference voltage signal may be an external reference voltage signal (e.g., V may correspond to an input AC voltage to be rectified by the switches). In some variations, the reference voltage value may be stored in a memory device (internal or external to the controller) and may be part of a sequence of reference values loaded sequentially from memory.

At step 311, the controller may compare V to a first threshold (e.g., thresh1). If V is below thresh1, then the controller may determine that switch Q1 is to be operated in PWM mode (e.g., switched between ON and OFF states at a frequency f1 in the kHz or MHz range). At step 312, after determining that switch Q1 is to be operated in PWM mode, switches Q2-Q3 may be kept OFF. At step 313, V may be compared to a value of a first carrier C1, which may be a triangular wave at a frequency of f1). At step 314, if Vis greater than C1, then Q1 may be turned ON. Additionally or alternatively, at step 315, if V is not greater than C1, then Q1 may be turned OFF. After step 314 or step 315, the controller may loop back to step 310 and may determine a new value of V. In some embodiments, since the result of step 311 may rarely change compared to the result of step 313 (for example, in the example waveforms of FIGS. 2A-2B, the result of step 311 may change 8 times per second and the result of step 313 may change 24,000 times per second), the controller may repeatedly (e.g. tens, or hundreds of times) skip directly to step 313 (indicated by the dashed line) following step 314 or 315 before returning to step 311. In this manner, step 313 may loop many times to determine whether a new V is greater than C1 without performing step 311 to determine whether V is greater than thresh1, as it may be expected that it may take many (e.g., hundreds) of loops before V is greater than thresh1. In some variations, the number of consecutive loop iterations (e.g., from step 313 to either of steps 314 or 315, to step 310, and then back to step 313) may depend on the value of V and on an estimate of when the result of step 311 may change again.

If, at step 311, the controller determines that V is greater than thresh1, then the controller may proceed to step 322. At step 322, the controller may compare V to a second threshold (e.g., thresh2) to determine if V is less than thresh2. At step 323, if V is not less than thresh2, then the controller may determine that switches Q1 and Q2 may be operated in PWM mode (e.g., switched between ON and OFF states at a frequency f2 in the kHz or MHz range). Additionally or alternatively, at step 331, if V is less than thresh2, then switches Q1 and Q3 may be kept OFF. At step 324, V may be compared to a value of a second carrier C2, which may be a triangular wave at a frequency of f2. At step 326, if V is greater than C2, then Q3 may be turned ON. Additionally or alternatively, at step 325, if V is not greater than C2, then Q3 may be turned OFF. After step 325 or step 326, the controller may loop back to step 310 and may determine a new value of V.

If, at step 322, the controller determines that V is less than thresh2, the controller may proceed to step 331. At step 331, the controller may determine that switches Q1 and Q3 may be kept OFF. and may determine that switch Q3 is to be operated in PWM mode according to a third carrier C3 at a third frequency f3, and may proceed to step 332. At step 332, the controller may compare V to a value of the third carrier C3, which may be a triangular wave at a frequency of f3, to determine if V is greater than C3. At step 332, if V is greater than C3, then Q2 may be turned ON. Additionally or alternatively, at step 333, if V is not greater than C3, then Q2 may be turned OFF. After step 333 or step 334, the controller may loop back to step 310 and determine a new value of V.

To reduce visual noise, dashed lines have not been drawn between step 310 and steps 324 and 332, but logically, they may exist. For example, the controller may skip from step 310 to steps 324 or 332, as described above with respect to step 313, because the result of determining whether V is greater than C2 or C3 may change far more often than the result of whether V is less than thresh2. Similar to the above, the number of "loop skips" may depend on V and on an estimate of when V may be less than thresh2.will change.

In a switch arrangement operated according to a reference signal and more than two thresholds, method 300 may be adapted accordingly to account for the additional thresholds. For example, when operating switch arrangement 100 of FIG. 1A according to the waveforms shown in FIG. 2D, the controller may operate Q1 in PWM mode upon detecting that the reference signal is either less than a fourth threshold or greater than a first threshold. Additionally or alternatively, the controller may operate Q2 in PWM mode upon detecting that the reference signal is either between the first and second thresholds or between the third and fourth thresholds, and so on.

In some cases, at steps 311 and 322, instead of comparing V to the first and second thresholds, the controller may compare the change in V to different thresholds. For example, the controller may retain a previous value of V when obtaining a new reference voltage value at step 310, and may calculate a difference between the two values. If the difference is below a first threshold, the controller may operate Q3 in the PWM mode while keeping Q2 and Q1 OFF, since a small difference between consecutive reference values is, according to some embodiments, correlated with large voltage values. If the difference is greater than the first threshold and less than the second threshold, the controller may operate Q2 in the PWM mode while keeping Q3 and Q1 OFF. If the difference is greater than the second threshold, the controller may operate Q1 in the PWM mode while keeping Q3 and Q2 OFF.

Figure 4A:
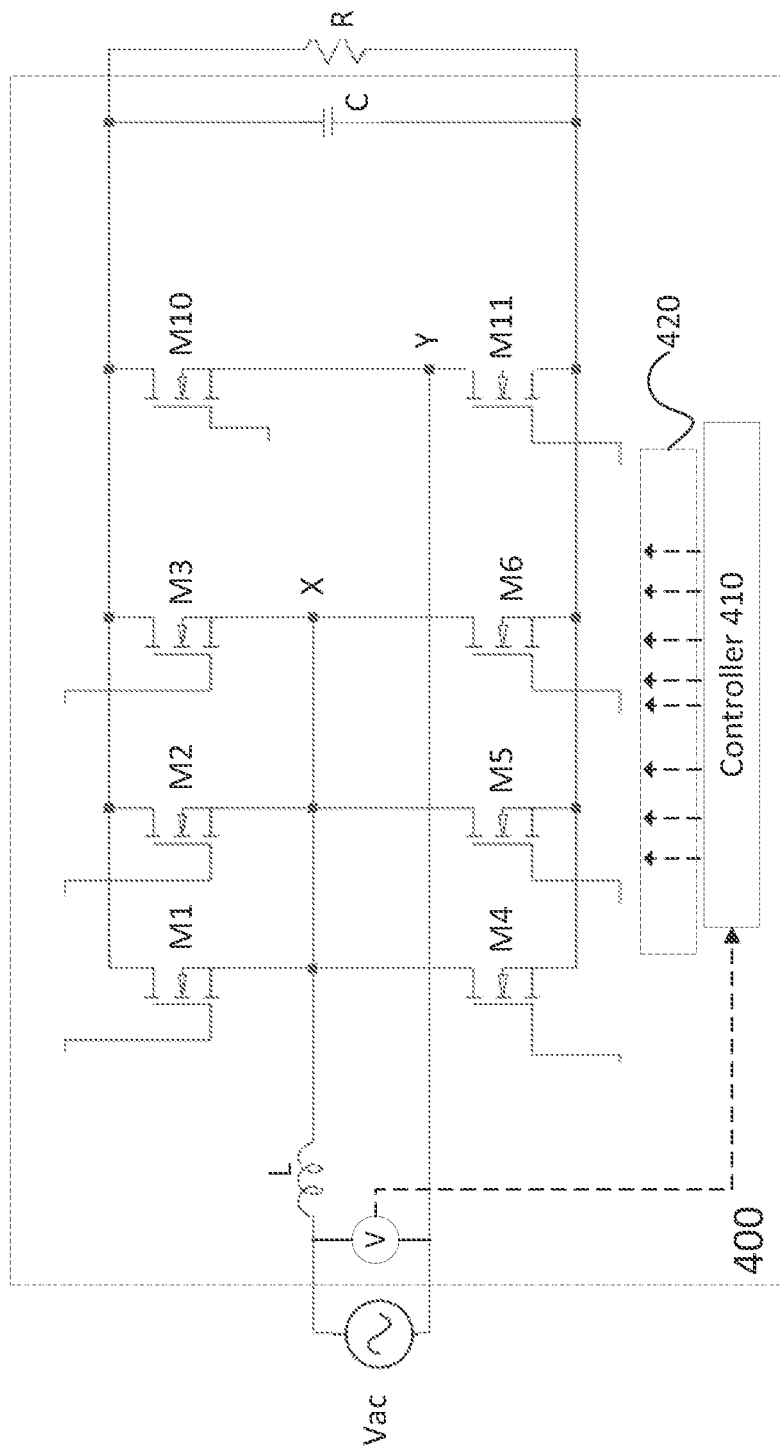
FIG. 4A shows an example of a power converter that may be used for efficient switching in accordance with the present disclosure.

Reference is now made to FIG. 4A, which shows a power converter (depicted here in an exemplary manner as an AC/DC converter, sometimes referred to as a rectifier) including a switching arrangement according to one or more aspects described herein. Vac may be an alternating current voltage input to rectifier 400, connected to rectifier input terminals. Switches M1-M6 may be arranged such that switches M1-M3 are connected in parallel to form a first parallel switch group. Switches M4-M6 may be connected in parallel to form a second parallel switch group. The first parallel switch group may be connected in series to the second parallel switch group and may be located between output converter nodes to form a first half bridge. Switches M10 and M11 may be connected in series between the output converter nodes to form a second half bridge. Inductor L may be connected between a first input terminal and a midpoint node X of the first half bridge. A second input terminal may be connected to a midpoint node Y of the second half bridge. Capacitor C may be connected across the output terminals, and resistor R may be a load of rectifier circuit connected across the output terminals. Controller 410 may be configured to control switches M1-M6 and M10-M11.

Switch module 110D of FIG. 1D or switch module 110E may be used to implement switches M1-M6 of FIG. 4A. Discrete components may be used for a customized switch arrangement.

Controller 410 may receive input voltage measurements from a voltmeter connected across the input terminals and, based on the input voltage measurements, via control lines 420 (drawn in an incomplete manner, to reduce visual noise), may control switches M1-M6 and M10-M11. Controller 410 may operate switches M1-M6 at relatively high frequencies (e.g., several kHz, tens or hundreds of kHz, even MHz, or GHz, etc.). Controller 410 may operate switches M10-M11 at a line frequency (e.g., 50 Hz or 60 Hz). During a positive AC frequency half-cycle, controller 410 may keep switch M11 ON and may keep switch M10 OFF, and may keep switches M1-M6 at higher frequencies according to changes in the input voltage during the positive half-cycle. During a negative AC frequency half-cycle, controller 410 may keep switch M11 OFF and switch M10 ON, and switches M1-M6 at higher frequencies according to changes in the input voltage during the negative half-cycle. This arrangement may provide a benefit of having only two switches (e.g., one from the first half bridge and one from the second half bridge) in a full conduction path during operation of the rectifier, reducing conduction losses, while the second half-bridge is switched at a line frequency, reducing switching losses. Furthermore, operating switches M1-M6 at different frequencies, according to a value of a reference voltage signal based on input voltage Vac, may further reduce switching and conduction losses, as described above.

Reference is now made to FIG. 4B, which shows example waveforms that may be measured and/or used in operation of the AC/DC converter of FIG. 4A.

The uppermost figure shows a reference signal (e.g., REF) that may track a sine wave for a first half of a sine wave period, and a shifted sine wave for a second half of a sine wave period:

$$REF(t) = \begin{cases} \sin(\omega t) & \text{for } \omega t < \pi \\ \sin(\omega t) + 1 & \text{for } \pi < \omega t < 2\pi \end{cases}$$

REF may be based on the input voltage to converter 400. For example, the input voltage may be sensed, and during a negative half-wave of the input voltage (e.g., when the input voltage is negative), a shifted REF sample may be provided to the control method that controls switches M1-M6 and M10-M11 based on the REF sample.

As indicated in FIG. 4B, switches M4-M6 may be switched by the controller based on a magnitude of reference signal REF. Switch M4 may be switched when REF is less than a first threshold (e.g., thresh1). Switch M5 may be switched when REF is greater than thresh1, but less than a second threshold (e.g., thresh2). Switch M6 may be switched when REF is greater than thresh2. Switch M1 may be substantially complementary to switch M4 (e.g., when switch M4 is ON, switch M1 is OFF, and vice-versa), switch M2 may be substantially complementary to switch M5, and switch M3 may be substantially complementary to switch M6.

To potentially increase converter efficiency, switch M4 may be implemented using a transistor characterized by having low switching losses. Additionally or alternatively, switch M6 may be implemented using a transistor having low conduction losses (i.e., a lower ON-resistance compared to switch M4). Additionally or alternatively, switch M5 may be implemented using a transistor characterized by having higher switching losses than switch M4, lower switching losses than switch M6, higher conduction losses than switch M6, and lower conduction losses than switch M4.

Switch M11 may be ON during the positive half-wave half-period of the input voltage and switch M10 may be ON during the negative half-wave half-period of the input voltage to provide a rectified DC voltage at the output terminals of converter 400.

A power converter similar to converter 400 may be operated as a DC-to-AC converter (e.g., an inverter), where a DC voltage input is provided (e.g., by one or more photovoltaic panels, batteries, capacitors, fuel cells, or other DC sources) and an AC voltage is output. In some embodiments, switches M1-M6 may be operated according to the magnitude of an output voltage of the converter (e.g., reference signal REF may be based on a measured or target output voltage).

In some embodiments, switches may be selected for use in operation in accordance with one or more aspects described herein, according to an expected time of operation in each phase of a reference voltage. For example, in some power electronics design problems, it may be difficult to predict or to estimate how long a power device will be in operation in a particular mode, and this difficulty may pose a challenge in selecting electronics for high-efficiency performance. In accordance with one or more aspects described herein, the duration of each time period for operation in a particular mode may be predetermined or pre-estimated, and electronics may be selected according to the predetermined or pre-estimated time periods.

For example, Plot D of FIG. 2D illustrates one scenario where a first switch may be operated in PWM mode during approximately 25% of each cycle. Plot C of FIG. 2D illustrates a scenario where a second switch that may be operated in PWM mode during approximately 27% of each cycle. Plot B of FIG. 2D illustrates a scenario where a third switch may be operated in PWM mode during approximately 48% of each cycle. In this embodiment, a circuit designer may emphasize selection of a high-quality third switch (e.g., a switch having low conduction losses) to improve total efficiency of the switch module.

In some variations, the first, second, third, and fourth thresholds of FIG. 2D may be modified such that each of the first, second, and third switches may be operated for substantially equal periods of time to reduce the risk of overheating a single switch. For example, with respect to FIG. 2A, changing the first threshold to 0.5 and the second threshold to 0.866 may result in substantially equal time portions for operating switches Q1-Q3 in PWM mode (e.g., if the first threshold is 0.5 and the second threshold is 0.866, then t1−t0≈t2−t1≈t3−t2). The thresholds may be further adjusted to account for variations in a PWM duty cycle of each switch, to optionally cause each switch to be ON for substantially equal periods of time, to carry a substantially equal average current, and/or to generate substantially equal switching and/or conduction losses, which may all promote heat generation being substantially uniformly generated by the switches.

Figure 5A:
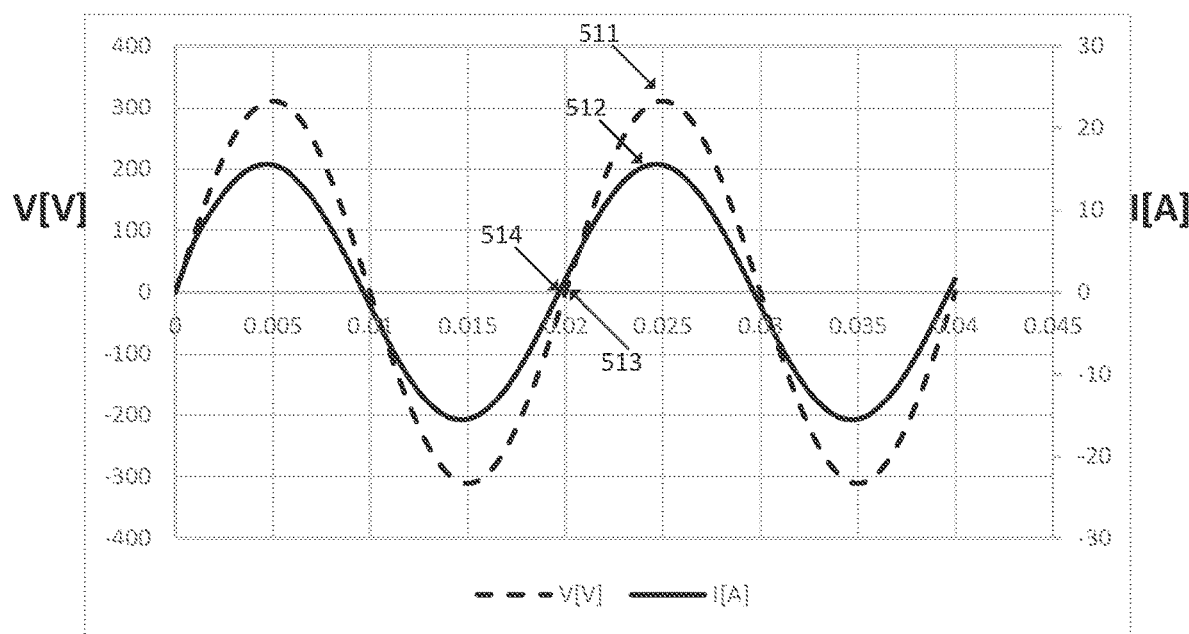
FIGS. 5A-5C show example current and voltage waveforms at an output of an inverter operated in accordance with the present disclosure.

Reference is now made to FIG. 5A, which shows example current and voltage waveforms that may be present at an output of an inverter operated in accordance with one or more aspects described herein. FIG. 5A illustrates a voltage waveform (dashed line) and a current waveform (solid line). The voltage waveform may be a sinusoid having an RMS amplitude of 220V and a 50 Hz frequency. The current waveform may be a sinusoid having an RMS amplitude of 11A and a 50 Hz frequency. The current waveform and the voltage waveform may be substantially in-phase, corresponding to a phase shift of approximately zero and a 'real power' mode of operation. The 'real power' mode of operation may be common when the inverter is connected to a well-balanced and stable electrical grid. The grid may apply a "clean" (i.e., not substantially distorted) sine wave voltage at the output of the inverter and may draw a "clean" sine wave output current from the inverter, such that the voltage and current sine wave outputs are substantially in-phase. In this case, voltage peak 511 and current peak 512 may occur substantially at a common time, and voltage zero-crossing 513 and current zero-crossing 514 may occur substantially at a common time. As discussed above, in this case, a switch exhibiting low switching losses (but potentially high conduction losses) may be operated at a relatively high frequency during a time segment corresponding to the voltage and current zero-crossings, and a different switch exhibiting low conduction losses (but potentially high switching losses) may be operated at a relatively low frequency during a time segment corresponding to the voltage and current peaks.

Figure 5B:
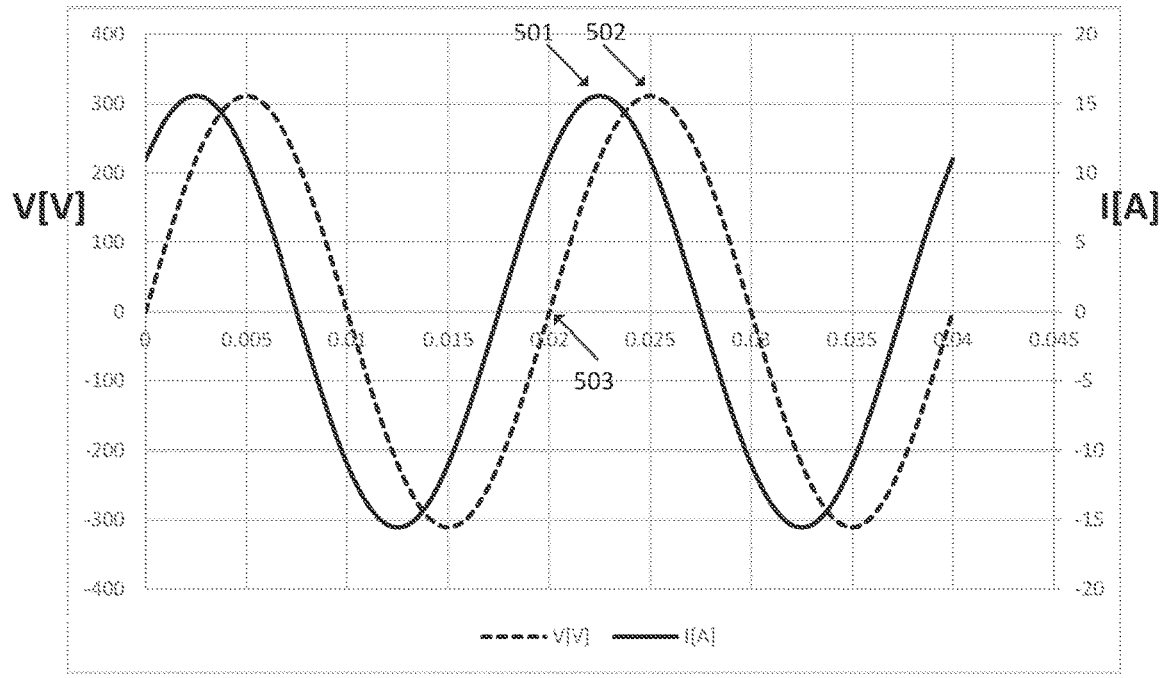

Reference is now made to FIG. 5B, which shows example current and voltage waveforms that may be present at an output of an inverter operated in accordance with one or more aspects described herein. FIG. 5B illustrates a voltage waveform (dashed line) and a current waveform (solid line). The voltage and current waveforms may be substantially the same as those of FIG. 5A, but may be phase-shifted approximately 45 degrees, corresponding to a 'combined real and reactive power' mode of operation. This mode of operation may occur when, in addition to providing the grid with real power, the inverter may inject reactive power into the grid (e.g., to maintain the grid voltage at a suitable level). In another mode of operation (not explicitly depicted herein), the inverter may provide a current waveform with a phase shift of 90 degrees compared to the voltage waveform and may inject, into the grid, reactive power, but might not inject active power.

In FIG. 5B, due to the 45 degree phase shift, voltage peak 502 may occur when a current value is rapidly changing. Voltage zero-crossing 503 may occur when a substantial current is flowing (e.g., about 10 A). In the 'combined real and reactive power' mode of operation, a controller of an inverter may selectively operate different switches during different time segments along the voltage sine wave. The controller may select the different switches to operate during different time segments according to measured current and/or voltage values and calculation, estimation, and/or prediction of losses associated with operating each switch.

Figure 5C:
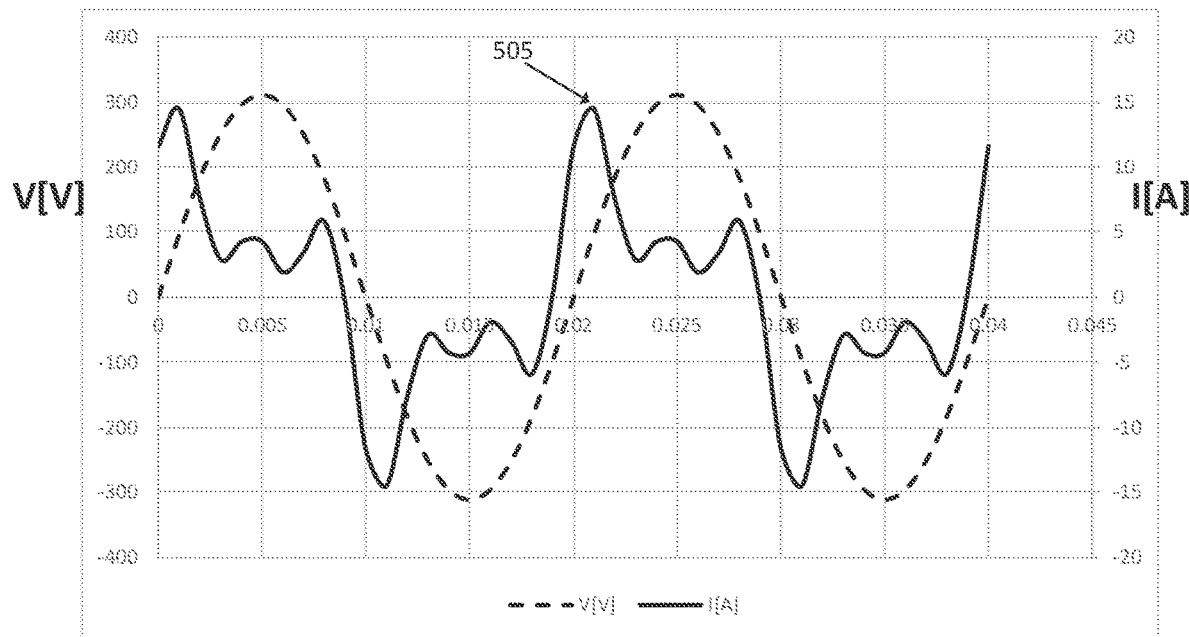

Reference is now made to FIG. 5C, which shows example current and voltage waveforms that may be present at an output of an inverter operated in accordance with one or more aspects described herein. FIG. 5C illustrates a voltage waveform (dashed line) and a current waveform (solid line). In this variation, the current waveform may be distorted. A distorted current waveform may be caused, for example, by nonlinear loads connected to the inverter output. For example, during a power outage, an inverter may enter a "backup power" mode of operation and may provide power to nonlinear loads present at a location (e.g., in a home). As another example, an inverter may be mounted within a particular location (e.g., a remote cabin), and may be connected solely to the loads present in the remote cabin and never connected to a large power grid. The current waveform of FIG. 5C may feature current peak 505, which may be relatively "sharp" (e.g., featuring a rapid rise and fall compared to a sine wave peak), leading to large current levels for relatively short periods of time and relatively small current levels for greater periods of time. Current peak 505 may occur at a time very close to the voltage zero-crossing, which may lead to a possible tradeoff between switch losses and conduction losses. It may be beneficial to operate a switch preferable for switch losses at a high frequency to better track the voltage waveform, which may change rapidly near the zero-crossing. Additionally or alternatively, it may be beneficial to operate a switch having low conduction losses to reduce losses caused by the current peak.

Figure 6B:
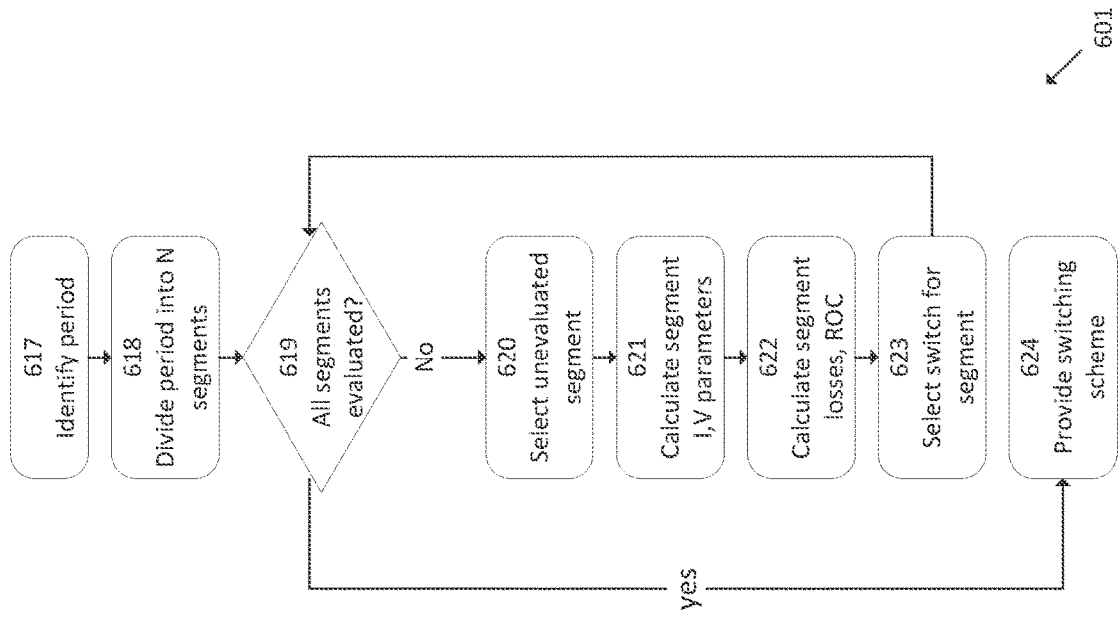
FIG. 6B shows an example method for selecting a switching scheme in accordance with the present disclosure.
Figure 6A:
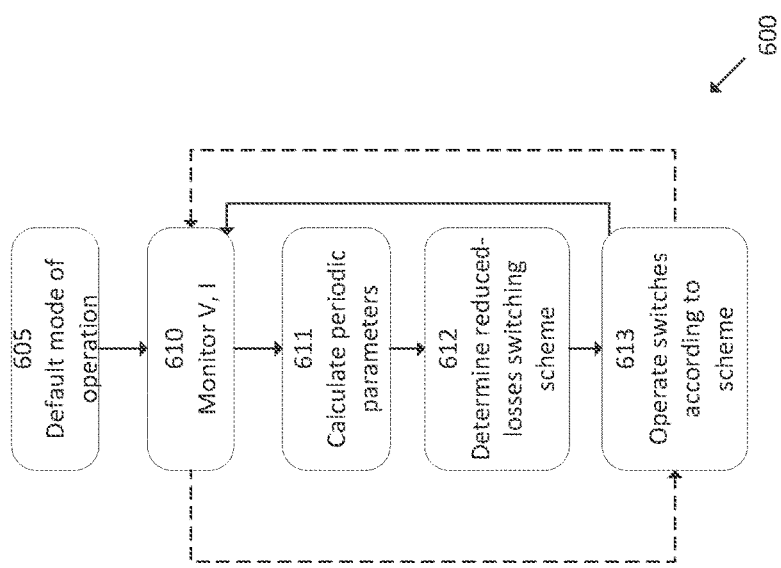
FIG. 6A shows an example method for operating a power converter in accordance with the present disclosure.

Reference is now made to FIG. 6A, which illustrates an example method for operating a power converter (e.g., an inverter) in accordance with one or more aspects described herein. The processes illustrated in FIG. 6A are merely sample processes and functions. Method 600 may be applicable to any of the embodiments disclosed herein, and may be particularly beneficial with respect to operating a power converter in the presence of voltage and current that are distorted (e.g., not "clean" sine waves) and/or phase shifted with respect to one another.

A controller may be configured to execute method 600 (e.g., a controller may be configured to operate one or more of the switches and/or switch modules disclosed herein). For example, the controller may be configured to operate the switches shown in FIGS. 1A-1G, controller 410 of FIG. 4A, and/or switches of an inverter configured to output the voltage and/or current waveforms of FIGS. 6A-6C). At step 605, the controller may select a default mode of operation (e.g., operate a particular switch of a plurality of parallel-connected switches or operate various switches according to a voltage waveform and without considering current measurements, as described in example method 300 of FIG. 3, and the like).

At step 610, the controller may monitor current and/or voltage at an input and/or an output of a power converter comprising the switches and/or switch modules (e.g., the controller may measure current and/or voltage inputs and/or outputs over time and may log the measurements).

At step 611, the controller may calculate periodic parameters related to the voltage and/or current monitored at the step 610. The periodic parameters may include, for example, frequency, amplitude and/or phase of the current and/or voltage. For example, the controller may identify (e.g., by performing calculations based on values obtained during the monitoring) one or more of a current peak, a current zero-crossing, a voltage peak, or a voltage zero-crossing. The controller may calculate the timing of the current peak during a cycle, the phase shift between the current peak and the voltage peak and/or the voltage zero-crossing, and/or the phase shift between the voltage peak and the current zero-crossing. The controller may calculate derivatives (e.g., a rate of change) of the voltage and/or the current at various points within the period.

At step 612, the controller may calculate estimated and/or predicted losses based on the periodic parameters calculated at step 611. For example, the controller may calculate expected losses associated with one or more different switching schemes. The controller may select a particular switching scheme based on that particular switching scheme having lower expected losses compared to another scheme. For example, the controller may determine that utilizing a single switch/switch-pair of a plurality of switches/switch-pairs (e.g. using only switch Q1 of FIGS. 1A and 1B or utilizing only switch pair Q1*a* and Q1*b* of FIG. 1D) may cause an estimated 10 W of combined conduction and switching losses per cycle. Additionally or alternatively, the controller may determine that utilizing two or more switches/switch-pairs at different times (e.g., using all of switches Q1-Q3 of FIGS. 1A and 1B or using all of the switch pairs of FIG. 1D) may cause an estimated 4 W of combined conduction and switching losses per cycle. The controller may select to utilize the switches causing the lower losses and, at step 613, may operate the switches according to the selected switching scheme.

The controller may continue to monitor the voltage and current waveforms over time to detect changes to the voltage and/or current signals and to adapt the switching scheme accordingly. However, it may be inefficient to implement all of the steps of method 600 constantly and for all time. Therefore, the controller may implement two control loops. A first loop (e.g., the fast loop), indicated by dashed lines, may cause the controller to continuously switch between steps 610 and 613, wherein continuously switching between steps 610 and 613 may cause the controller to continuously operate the switches according to the selected switching scheme while continuously monitoring the voltage and current processes by the converter. A second loop (e.g., the slow loop), indicated by the solid lines, may cause the controller to periodically (e.g., every second, several seconds, tens of seconds, or minutes) re-calculate periodic parameters and determine a reduced-losses switching scheme.

Reference is now made to FIG. 6B, which illustrates an example method for selecting a switching scheme in accordance with one or more aspects described herein. Method 601 may be used as step 612 in method 600 of FIG. 6A, and may be executed by a controller similar to or incorporating the controller executing method 600. In some variations, for example to reduce a computational load on the controller executing method 600, a separate controller may be used.

At step 617, the controller may identify a time period used for loss-analysis. The time period may be obtained as a result of calculations performed at step 611 of method 600. Additionally or alternatively, the controller may identify the time period using input from a user (e.g., a configuration parameter input via a graphical user interface). Additionally or alternatively, the time period may be hard-coded (e.g., for an inverter configured to output a 50 Hz voltage waveform, the time period may be hard-coded as being 20 ms).

At step 618, the controller may divide the time period into a number of segments for separate analysis (e.g., the time period may be divided into N segments, wherein N may be 2, 3, 4, 10, 100, or even more). At step 619, the controller may evaluate whether all segments have been evaluated or analyzed. If the controller determines that there is at least one segment that has not been evaluated, then the controller may proceed to step 620. At step 620, the controller may select a segment that has not been evaluated.

At step 621, the controller may calculate the current and voltage parameters associated with the segment identified in step 620. The parameters may include amplitudes, phases, rates of change (ROC) of the voltage and/or current within the segment, and the like. In some variations, the controller may base its calculations on measured current and voltage values. Additionally or alternatively, in some embodiments, the controller may base its calculations on predicted and/or estimated values.

At step 622, the controller may calculate segment losses according to one or more switching schemes within the segment. The losses may correspond to measured losses. The controller may calculate measured losses by multiplying the measured current and voltage values at the input and output of a power converter, and subtracting the output power from the input power to obtain losses. Additionally or alternatively, the losses may correspond to predicted losses. The controller may calculate predicted losses by squaring a measured current and multiplying the squared current with several potential Rds_on values, wherein each Rds_on value may correspond to a different switch. Additionally or alternatively, the controller may calculate predicted losses by calculating, based on a measured voltage, switching loss across one or more switches being switched under the measured voltage and determining how many times the switches may need to be switched in order to meet the requisite voltage rate-of-change within the segment.

At step 623, the controller may select a switch for utilization in the segment under analysis, and may select a switching frequency for use within the segment. For example, the controller may determine that a certain segment incurred average losses of 3 W when utilizing a first switch, that the losses were predominantly due to conduction losses, and that the segment could have incurred average losses of 2 W if a different switch (e.g., having a smaller Rds_on) were used. The controller may determine that a third switch, having an even larger Rds_on, would incur losses of 6 W, and may, therefore, be less suitable.

The controller may balance conduction loss considerations with switching loss and/or ROC considerations. For example, the controller may determine that a first switch may provide lower conduction losses, but might not meet the required voltage ROC unless it were switched at a high frequency that would cause increased switching losses. The controller may select a switch and a switching frequency for operating the switch such that total losses may be reduced and the resultant waveforms may be satisfactory (e.g., conforming to harmonic distortion requirements and the like).

In some embodiments, if only a single switch is available, the controller may select a segment switching frequency for the switch to reduce losses as much as possible. The controller may select a lower frequency for segment switching as a lower frequency may result in fewer losses. Additionally, the controller may select a segment switching frequency that may maintain a required ROC. However, lower frequency segment switching may make it difficult for the controller to maintain a high ROC. If only a single frequency is available, then the controller may select a segment switch in order to reduce combined switching and conduction losses as much as possible. The controller may save the switch and/or selected frequency to memory, and may return to step 619.

If, at step 619, the controller determines that all segments have a switch and an associated switching frequency, then the controller may proceed to step 624. At step 624, the controller may provide the collection of segments, switches, and frequencies to a controller (which may be the same controller) or other mechanism configured to operate the switches at the selected frequencies.

In one or more of the variations disclosed herein, a controller may be configured to operate a first switch for incurring preferred (e.g., lower) switching loss, and a second switch for reducing conductance losses. For example, during a first time period, a first switch having low switching losses may be used for transitioning between ON and OFF states, and a second switch having a low Rds_on may be switched to the same state as the first switch to obtain lower conductance losses. For example, in switch arrangement 130 of FIG. 1G, switch Q1 may be used to "hard switch" between ON and OFF states, and switch Q3 may "follow" switch Q1 (e.g., turn ON right after Q1) in order to reduce conduction losses. The same technique may be applied to the switch arrangements for FIGS. 1A-1G and 4A.

In one or more of the variations disclosed herein, a controller may, instead of or in addition to monitoring current and/or voltage values, predict future current and/or voltage values, and may determine a switching scheme according to the predicted values. For example, an inverter may be configured to output a voltage signal according to a sequence of reference values loaded sequentially from memory. The inverter may predict a voltage value at a future time and may select a switch for operation during one or more time portions of a period based on the predicted voltage. The controller may predict and/or estimate current at a future time. The controller may predict and/or estimate future losses according to the predicted and/or estimated voltage and/or current. The controller may select a switch for operation during one or more time portions of a period based on the predicted and/or estimated future losses.

Although examples are described above, features and/or steps of those examples may be combined, divided, omitted, rearranged, revised, and/or augmented in any desired manner.

Various alterations, modifications, and improvements will readily occur to those skilled in the art. Such alterations, modifications, and improvements are intended to be part of this description, though not expressly stated herein, and are intended to be within the spirit and scope of the disclosure. Accordingly, the foregoing description is by way of example only, and is not limiting.

What is claimed is:

1. An apparatus comprising:
   a power converter having an input and an output, the power converter comprising:
      a first switch;
      a second switch coupled in parallel to the first switch;
   a controller configured to:
      during a first portion of a time period, control the first switch according to a first pulse-width- modulation (PWM) signal while keeping the second switch off; and
      during a second portion of the time period, control the second switch according to a second PWM signal while keeping the first switch off,
         wherein the time period corresponds to a period of an electrical grid frequency associated with an electrical grid to which the apparatus is connected;
      wherein:
      the first PWM signal has a first frequency, and
      the second PWM signal has a second frequency that is higher than the first frequency; and
   a third switch connected in parallel to the first switch and the second switch, and wherein the controller is configured to:
      keep the third switch off when controlling, based on a reference value, the first switch according to the first PWM signal;
      keep the third switch off when controlling, based on the reference value, the second switch according to the second PWM signal;
      control, based on the reference value, the third switch according to a third PWM signal while keeping the first switch off and keeping the second switch off, wherein the third PWM signal has a third frequency that is higher than the second frequency of the second PWM signal; and
      wherein the power converter is a direct current to alternating current (DC-to-AC) converter, and wherein the controller is configured to switch the first switch and the second switch on or off based on the reference value, wherein the reference value is based on an output voltage of the DC-to-AC converter.

2. The apparatus of claim 1, wherein the second switch has an ON-resistance that is higher than an ON-resistance of the first switch.

3. The apparatus of claim 1, wherein switching the second switch consumes less energy than switching the first switch.

4. The apparatus of claim 1, wherein at least one of the first switch or the second switch comprises a Metal Oxide Semiconductor Field Effect Transistor (MOSFET).

5. The apparatus of claim 1, wherein at least one of the first switch or the second switch comprises back-to-back transistors.

6. A method comprising:
   operating, by a power converter, a first switch and a second switch coupled in parallel to the first switch;
   controlling, during a first portion of a time period, the first switch according to a first pulse-width-modulation (PWM) signal while keeping the second switch off;
   controlling, during a second portion of the time period, the second switch according to a second PWM signal while keeping the first switch off,
      wherein the time period corresponds to a period of an electrical grid frequency associated with an electrical grid to which the power converter is connected;
   wherein:
      the first PWM signal has a first frequency, and
      the second PWM signal has a second frequency that is higher than the first frequency;
   keeping a third switch off when controlling, based on a reference value, the first switch according to the first PWM signal, wherein the third switch is connected in parallel to the first switch and the second switch;
   keeping the third switch off when controlling, based on the reference value, the second switch according to the second PWM signal;
   controlling, based on the reference value, the third switch according to a third PWM signal while keeping the first switch off and keeping the second switch off, wherein the third PWM signal has a third frequency that is higher than the second frequency of the second PWM signal, wherein the power converter is a direct current to alternating current (DC-to-AC) converter; and
   switching, based on the reference value, the first switch and the second switch on or off, wherein the reference value is based on an output voltage of the DC-to-AC converter.

7. The method of claim 6, wherein:
   the controlling the first switch comprises switching, during the first portion of a periodic waveform output by the power converter, the first switch according to the first PWM signal while keeping the second switch off; and
   the controlling the second switch comprises switching, during the second portion of the periodic waveform, the second switch according to the second PWM signal while keeping the first switch off.

8. The method of claim 6, wherein:
   the controlling the first switch comprises switching, during the first portion of the period of the electrical grid frequency associated with the electrical grid to which the power converter is connected, the first switch according to the first PWM signal while keeping the second switch off; and
   the controlling the second switch comprises switching, during the second portion of the period of the electrical grid frequency, the second switch according to the second PWM signal while keeping the first switch off.

9. The method of claim 6, wherein:
the controlling the first switch comprises switching, during the first portion of the time period, the first switch according to the first frequency of the first PWM signal while keeping the second switch off; and
the controlling the second switch comprises switching, during the second portion of the time period, the second switch according to the second frequency of the second PWM signal, while keeping the first switch off.

* * * * *